(12) United States Patent
Yasuda

(10) Patent No.: US 6,320,529 B1
(45) Date of Patent: Nov. 20, 2001

(54) A/D CONVERSION APPARATUS AND A RADIO APPARATUS

(75) Inventor: Akira Yasuda, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/398,820

(22) Filed: Sep. 20, 1999

(30) Foreign Application Priority Data

Sep. 29, 1998 (JP) .................................................. 10-276040

(51) Int. Cl.$^7$ ...................................................... H03M 1/12
(52) U.S. Cl. ............................................. 341/155; 341/143
(58) Field of Search ................................. 341/143, 155, 341/141, 166

(56) References Cited

U.S. PATENT DOCUMENTS

| | | |
|---|---|---|
| 3,921,527 | 11/1975 | Raschke et al. . |
| 4,030,416 | 6/1977 | Schank . |
| 5,227,795 * | 7/1993 | Yamakido et al. .................. 341/166 |
| 5,565,868 | 10/1996 | Azrouf et al. . |
| 5,754,131 * | 5/1998 | Ribner et al. ........................ 341/143 |
| 5,841,388 | 11/1998 | Yasuda et al. . |
| 5,986,595 * | 11/1999 | Lyden et al. ......................... 341/118 |

FOREIGN PATENT DOCUMENTS

| | | |
|---|---|---|
| 0 028 137 | 5/1981 | (EP) . |
| 0 281 727 | 9/1988 | (EP) . |
| 0 631 209 | 12/1994 | (EP) . |

OTHER PUBLICATIONS

Hai TAO, et al. "Direct–conversion bandpass sigma–delta modulator", Electronics Letters, Jul. 17, 1997, vol. 33, No. 15, pp. 1282–1283.

* cited by examiner

*Primary Examiner*—Peguy JeanPierre
(74) *Attorney, Agent, or Firm*—Oblon, Spivak, McClelland, Maier & Neustadt, P.C.

(57) ABSTRACT

A subtraction section subtracts a first signal from a second signal as a harmonic signal and outputs a third signal as a subtraction result. A first conversion section converts the third signal into a digital signal of predetermined frequency different from a frequency of the second signal. A second conversion section converts the digital signal into an analog signal of a frequency nearly equal to the frequency of the second signal and supplies the analog signal as the first signal to the subtraction section. The second conversion section includes a plurality of conversion elements, a filter to calculate a number of use of each of the plurality of conversion elements, and a selector to select, the conversion elements having a lower value of the number of use. The number of conversion elements selected corresponds to the value of the digital signal.

42 Claims, 23 Drawing Sheets

A/D CONVERSION APPARATUS AND A RADIO APPARATUS

FIELD OF THE INVENTION

The present invention relates to an A/D conversion apparatus and a radio apparatus to convert a received analog signal to a digital signal of predetermined frequency.

BACKGROUND OF THE INVENTION

In case of demodulation of digital processing in a receiver, a receiving signal input from an antenna is passed through a first filter. In the first filter, the receiving signal is converted to the predetermined frequency lower than a frequency of input modulation signal. After eliminating any unnecessary signals from the converted analog signal by a second filter, an A/D converter converts this analog signal to a digital signal. A digital demodulator demodulates the digital signal to regenerate the original baseband signal.

In a radio apparatus, a bandwidth of the signal is narrow in comparison with the carrier frequency. As mentioned-above, a modulation signal as the receiving signal is down-converted to a frequency of low signal bandwidth and digitized by the A/D converter. As a result, sampling frequency of the A/D converter is low, and a low-cost, low speed A/D converter is used. In this case, in order to correctly obtain the demodulation output, characteristics of low distortion and low noise are required for a mixer of the frequency converter. Furthermore, input to the mixer is the demodulation signal received through a wireless transmission path, and the input level widely varies. However, the mixer is generally comprised of a non-linear circuit. Therefore, it is difficult to realize the mixer of characteristics of low distortion over a wide range of the input level.

As a solution means of this problem, the radio (wireless) receiver shown in FIG. 1 is proposed. In FIG. 1, an RF signal (modulation signal) received by the antenna 11 is input to the A/D conversion apparatus 10 through a preamplifier 12. The A/D conversion apparatus 10 converts the RF signal to a digital signal of predetermined frequency below the frequency of the RF signal. The digital signal is demodulated by the demodulator 22.

The A/D conversion apparatus 10 comprises a subtractor 13, a loop mixer 14, a mixer 15, a reference signal generator 16, a filter 17, an A/D converter 18, a D/A converter 19, a mixer 20, and a reference signal generator 21. As a whole, this component is formed as a negative feedback loop. The mixer 15 and the reference signal generator 16 comprise a first frequency converter (down converter) to convert an output signal from the subtractor 13 to a predetermined frequency below the frequency of input signal Sin. The mixer 20 and the reference signal generator 21 comprise a second frequency converter (up converter) to convert a feedback signal Sf to the subtractor 13 to a frequency nearly equal to the frequency of the input signal Sin.

The subtractor 13 subtracts the feedback signal Sf from the input signal Sin. An output signal from the subtractor 13 is input to the mixer 15 through the loop filter 14 and multiplied with a reference signal from the reference signal generator 16 to convert it to a predetermined frequency below the frequency of the input signal Sin, i.e., a frequency of bandwidth of baseband signal or an intermediate frequency. Output from the mixer 15 (output from the first frequency converter) includes an unnecessary frequency component whose frequency is above or below the predetermined frequency. The output from the mixer 15 is input to the filter 17 to pass the predetermined frequency component by eliminating the unnecessary frequency component and converted to a digital signal by the A/D converter 18.

Output from the A/D converter 18 is supplied to the demodulator 22 and the D/A converter 19 as an output signal Sout. The D/A converter 19 converts the output signal Sout to the analog signal. Output from the D/A converter 19 is input to the mixer 20, and multiplied with the reference signal from the reference signal generator 21 to convert to a frequency nearly equal to the frequency (career frequency) of the input signal Sin. Output from the mixer 20 (output from the second frequency converter) is supplied to the subtractor 13 as the feedback signal Sf.

In FIG. 1, the A/D conversion apparatus 10 is adopted as a noise shaping type ($\Delta\Sigma$ type A/D converter), and formed as the negative feedback loop as a whole. The first frequency converter consisting of the mixer 15 and the reference signal generator 16 is included in the main signal path of the negative feedback loop, i.e., a signal path from input to output of the A/D conversion apparatus 10. Accordingly, less than perfect operation (characteristics of distortion and noise) of the mixer 15 is relieved by operation of the negative feedback loop. In a theory of the negative feedback circuit, it is proved that distortion and noise existed in the main signal path are suppressed.

On the other hand, the second frequency converter consisted of the D/A converter 19, the mixer 20 and the reference signal generator 21 is included in feedback signal path of the feedback loop. The noise and distortion generated from the D/A converter 19 and the mixer 20 affects accuracy of the feedback signal Sf. Accordingly, excellent characteristics of low distortion and low noise are required for the D/A converter 19 and the mixer 20.

As a result, in FIG. 1, a number of bits of the A/D converter 18 and the D/A converter 19 are relatively set small, and dynamic range of the input signal to the D/A converter 19 and the mixer 20 is set narrow in order to easily comprise the D/A converter and the mixer of low distortion and low noise. Especially, if the number of bits of the A/D converter 18 and the D/A converter 19 is 1, a high accurate mixer can easily be realized. However, in such composition, the number of bits of the A/D converter 18 is small and a quantized noise generated from the A/D converter 18 is large. As a result, a noise chracteristics of the A/D conversion apparatus 10 falls.

SUMMARY OF THE INVENTION

It is an object of the present invention to provide an A/D conversion apparatus and a radio apparatus to easily realize a frequency conversion function of high accuracy without characteristics of low distortion and low noise for wide range of input level while the number of quantized bits of the A/D converter is large.

According to the present invention, there is provided an A/D conversion apparatus including subtraction means for subtracting a first signal from a second signal, and for outputting a third signal as a subtraction result; first conversion means for converting the third signal to a digital signal of predetermined frequency different from a frequency of the second signal; and second conversion means for converting the digital signal to an analog signal of a frequency nearly equal to the frequency of the second signal; and for supplying the analog signal as the first signal to said subtraction means. Further, the second conversion means includes a plurality of current sources, a filter means for calculating a number of use of each of the plurality of current sources, and a selection means for selecting the current source having a lower value of the number of use. The number of selected current sources corresponds to a value of the digital signal.

Further in accordance with the present invention, there is also provided an A/D conversion apparatus including subtraction means for subtracting a first signal from a second signal, and for outputting a third signal as a subtraction result; first conversion means for converting the third signal to two digital signals whose frequency are orthogonal to each other and are different from a frequency of the second signal; and second conversion means for converting the two digital signals to two analog signals, and for adding the two analog signals as the first signal whose frequency is nearly equal to the frequency of the second signal. Further, the second conversion means includes a plurality of current sources, a filter means for calculating a number of use of each of the plurality of current sources, and a selection means for selecting the current sources having a lower value of the number of use. The number of selected current sources corresponds to each value of the two digital signals.

DETAILED DESCRIPTION OF THE PREFERRED EMBODIMENTS

Figure 1:
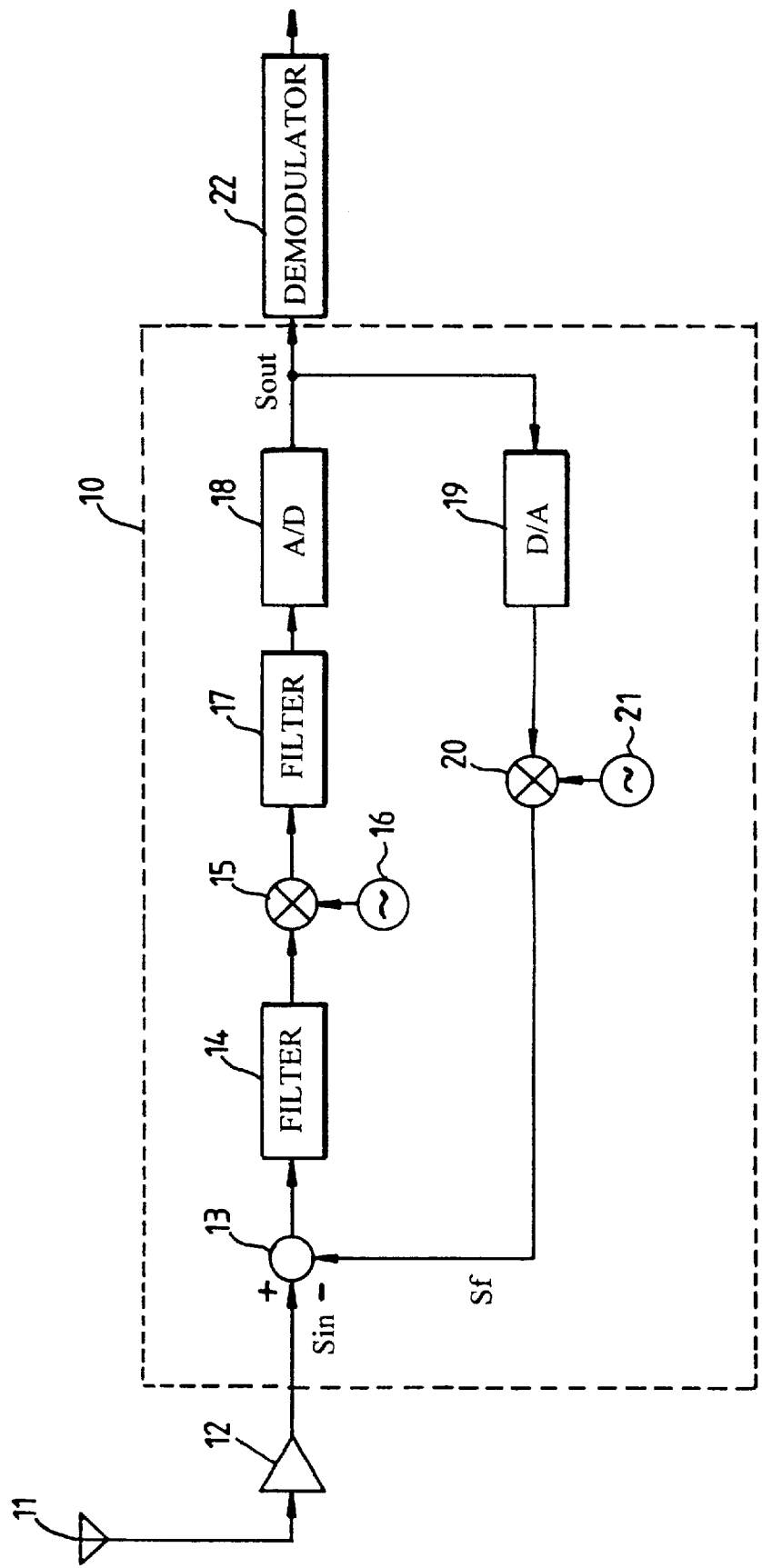
FIG. 1 is a block diagram of an A/D conversion apparatus according to the prior art.
Figure 2:
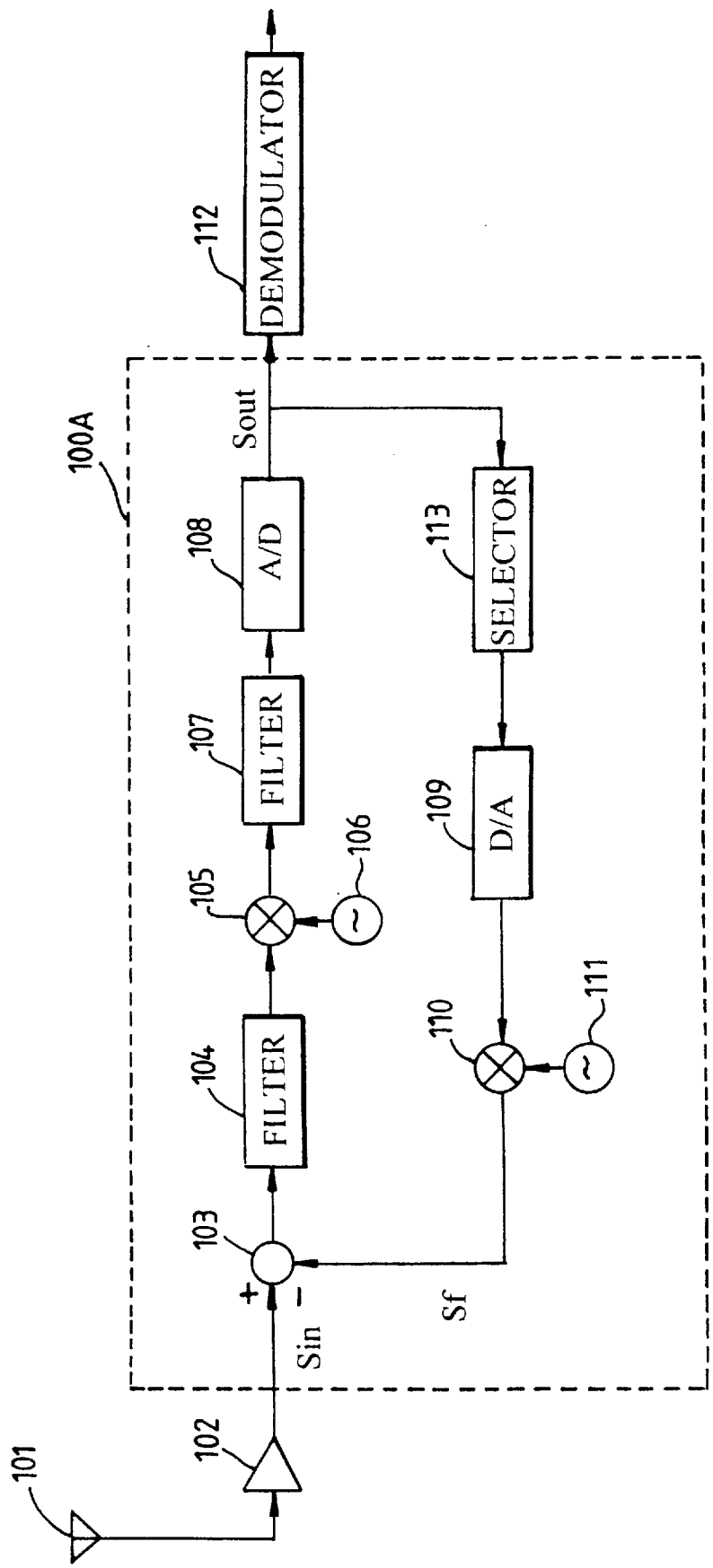
FIG. 2 is a block diagram of an A/D conversion apparatus according to a first embodiment of the present invention.

FIG. 2 is a block diagram of the A/D conversion apparatus in a receiver of the radio apparatus according to the first embodiment of the present invention. In FIG. 2, RF signal (modulation signal) received by antenna 101 is input to the A/D conversion apparatus 100A through the preamplifier 102. The RF signal is converted to a digital signal of predetermined frequency lower than a frequency of the RF signal. The digital signal is input to the demodulator 112, and demodulated by digital processing.

The A/D conversion apparatus 100A consists of a subtractor 103, a loop filter 104, a mixer 105, a reference signal generator 106, a filter 107, an A/D converter 108, a selector 113, a D/A converter 109, a mixer 110, and a reference signal generator 111 as the feedback loop. The mixer 105 and the reference signal generator 106 comprises a first frequency converter (down converter) to convert the output signal from the subtractor 103 to the predetermined frequency lower than the frequency of the input signal Sin.

The mixer 110 and the reference signal generator 111 comprise a second frequency converter (up converter) to convert the feedback signal Sf sent to the subtractor 103 to a frequency nearly equal to the frequency of the input signal Sin.

The subtractor 103 subtracts the feedback signal Sf from the input signal Sin to the A/D conversion apparatus 100A. The output signal from the subtractor 103 is input to the mixer 105 through the loop filter 104, and multiplied with a reference signal from the reference signal generator 106. In this way, the frequency of the input signal Sin is converted to lower predetermined frequency such as a frequency of bandwidth of baseband signal or an intermediate frequency.

An output signal from the mixer 105 (output from the first frequency converter) includes an unnecessary frequency component higher or lower than the predetermined frequency component. Therefore, the output signal is input to the filter 107 to pass only the predetermined frequency component by eliminating the unnecessary frequency component. The predetermined frequency component is input to the A/D converter 108 and converted to a digital signal.

An output signal Sout from the A/D converter 108 is sent to the demodulator 112 and the D/A converter 109 through the selector 113. The output signal Sout is converted to the analog signal by the D/A converter 109.

An output signal from the D/A converter 109 is input to the mixer 110 and multiplied with a reference signal from the reference signal generator 111. As a result, a frequency of the output signal is converted to almost equal frequency of the input signal Sin (career frequency). An output signal from the mixer 110 (output from the second frequency converter) is supplied to the subtractor 103 as the feedback signal Sf.

In FIG. 2, the A/D conversion apparatus 100A is adopted as a noise shaping type (ΔΣ type A/D converter), and formed as the negative feedback loop as a whole. The first frequency converter consisting of the mixer 105 and the reference signal generator 106 is included in the main signal path of the negative feedback loop, i.e., a signal path from input to output of the A/D conversion apparatus 100A. Accordingly, less than perfect operation (characteristics of distortion and noise) of the mixer 105 is relieved by operation of the negative feedback. In a theory of the negative feedback circuit, it is proved that distortion and noise existed in the main signal path are suppressed.

On the other hand, the second frequency converter consisting of the D/A converter 109, the mixer 110 and reference signal generator 111 is included in feedback signal path of the negative feedback loop. The noise and distortion generated from the D/A converter 109 and the mixer 110 affects accuracy of the feedback signal Sf. Accordingly, excellent characteristics of low distortion and low noise are required for the D/A converter 109 and the mixer 110. In order to solve this problem, in the first embodiment, the output signal from the A/D converter 108 is input to the selector 113. The selector 113 selects a number of conversion elements corresponding to the output signal in order of lower number of use from a plurality of conversion elements included in the D/A converter 109.

Figure 3:
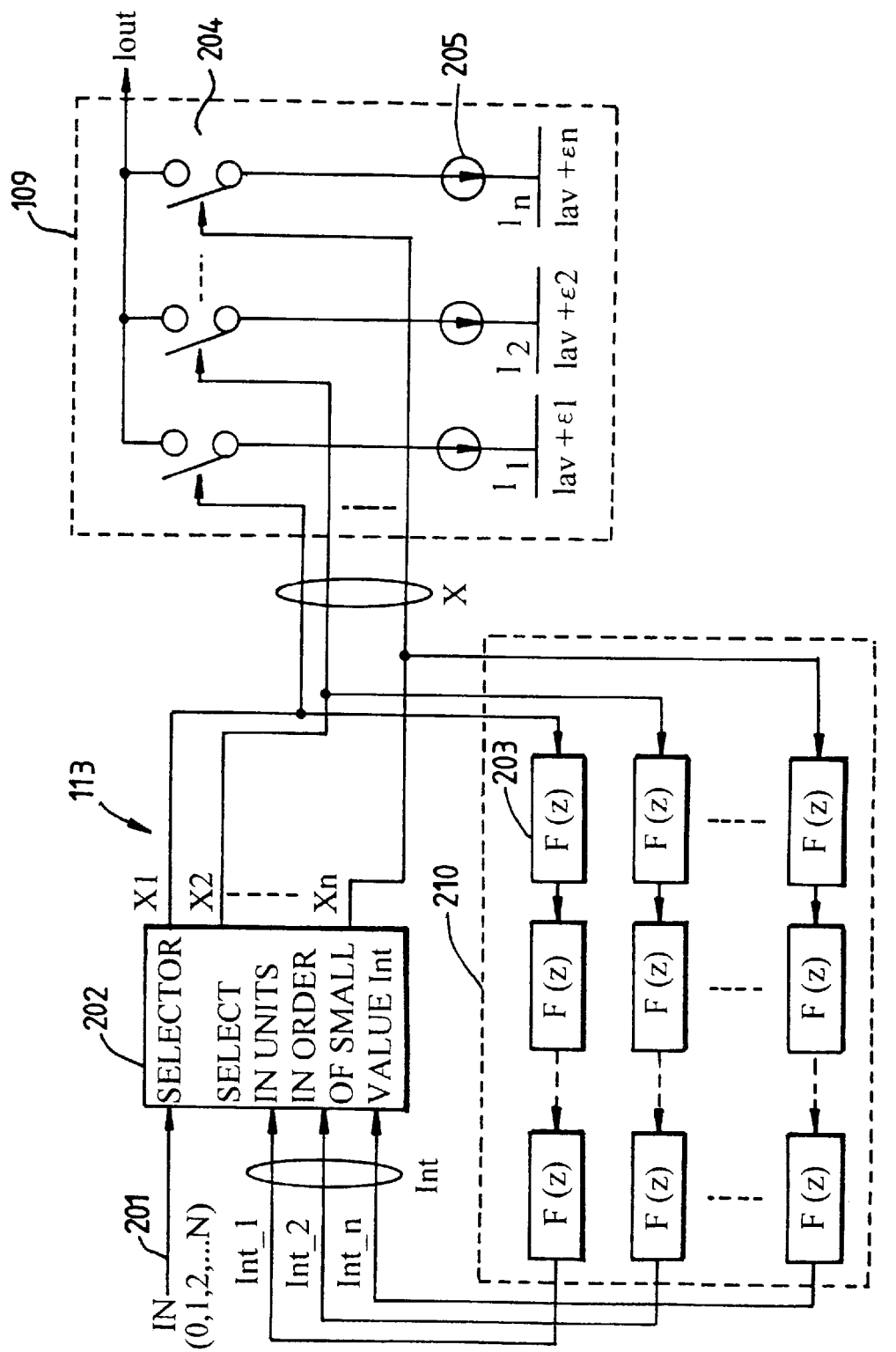
FIG. 3 is a block diagram of the selector and the D/A converter in FIG. 2.

FIG. 3 is a block diagram of the selector 113 and the D/A converter 109. In FIG. 3, the D/A converter 109 is consists of n units of switches 204 and n units of current sources 205 of equal current value. Each source 205 is serially connected to each switch 204. In this embodiment, the current source 205 is the conversion element opposite terminals of the switches 204 for the current source 205 is commonly connected, and an analog output current Iout is supplied from this common connection node.

In operation, the D/A converter 109 selects a number of the current sources 205 by turning on the corresponding switch 204. The total number of the current source s selected is determined by a value of the input digital signal 201. In this embodiment, the higher the digital value is, the greater the number of current sources selected is. A sum of the current values from the selected current sources 205 is output a s analog output current Iout.

The selector 113 comprises a selector 202 and a filter circuit 210. The digital signal 201 from the A/D converter 108 is input to the selector 202. This digital input signal 201 is used as a signal representing the number IN to select the conversion elements (the current source 205) in the D/A converter 109. In response to the digital input signal 201, the selector 202 determines IN units corresponding to value of the digital input signal from n units of selection signal path Xi (X1~Xn) connected to each switch 204, and outputs a selection signal "1" to the IN units of signal path and non-selection signal "0" to the other signal paths. This selection signal is also input to the filter circuit 210. An output $Int\_i$ (i=1~n) from the filter circuit 210 is input (feedbacked) to the selector 202. The selector 202 selects the IN units to output the selection signal "1" from the selection signal paths Xi (X1~Xn) in order of lower value of Int_i (i=1~n). This selection signal is input to the D/A converter 109 to turn on the IN units of the switches corresponding to "Xi=1" and to turn off the other switches corresponding to "Xi=0".

The filter circuit 210 consists of a plurality of filters 203 and calculates a number of use Int_i (i=1~n) of each current source 205 in the D/A converter 109 by filtering the selection signal Xi. (For example, integration). The selection signal Xi from the selector 202 is respectively input to corresponding filter 203. Each filter 203 outputs the number of use of corresponding current source as the input signal Int_i (i=1~n) to the selector 202. In case of using "$F(Z)=1/(1-Z^{-1})$" as characteristics of each filter 203, noise neighboring low frequency of the output signal fro m the D/A converter 109 is reduced.

In the D/A converter 109, a sum of current from the current sources 205 corresponding to the selection signal "Xi=1" is output as the output current Iout. In short, the output current Iout is determined by the number IN of the selection signal "Xi=1". In case of realizing the D/A converter 109 by LSI, the current source 205 is realized by a transistor. In this case, output current from each current source 205 is not exactly equal because of dispersion of transistor characteristics, and the output current Iout from the D/A converter 109 includes a conversion error. However, in the first embodiment, the effect of the conversion error for bandwidth of predetermined frequency is reduced. This reason is explained as follows.

Figure 4:
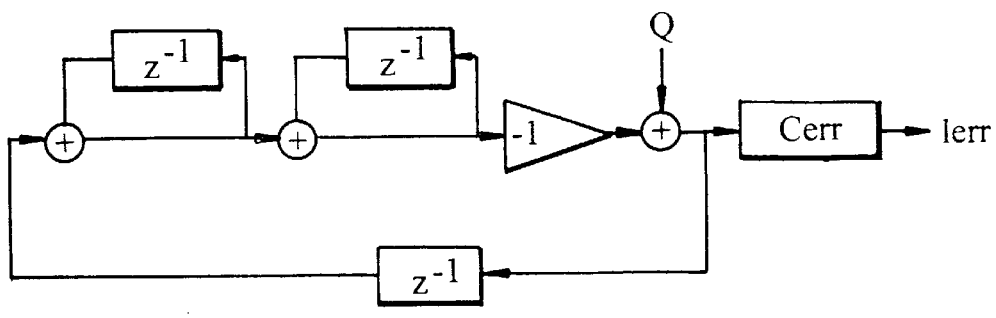
FIG. 4 is a block diagram of an equivalent circuit for operation principle of the first embodiment.

FIG. 4 is an equivalent circuit of the D/A conversion apparatus consisting of the selector 113 and the D/A converter 109 in FIG. 2. In FIG. 4, a thick line represents a vector signal and a thin line represents a scalar signal. The selector 113 and the D/A converter 109 include components shown in FIG. 3. A transfer function of the filter 203 is set as "$F(Z)=1/(1-Z^{-1})$". The filter circuit 210 consists of two filters 203 by cascade connection and a total transfer function is set as "$(1-Z^{-1})^2$".

In FIG. 4, "Q" represents noise generated from a restriction that the selector 202 outputs only the IN units of selection signal "1" corresponding to the input signal 201. "Cerr" represents error current of the plurality of current sources 205 in the D/A converter 109 in FIG. 3. "Ierr" represents error current included in the output current Iout. In this equivalent circuit, the transfer function of the D/A conversion apparatus consisting of the selector 113 and the D/A converter 109 is represented as follows.

$$Ierr=Cerr\,(1-Z^{-1})^2 Q \qquad (1)$$

In above equation, "$(1-Z^{-1})^2$" is called a noise shaping term, of which value is "0" for low frequency area. Accordingly, noise current of the low frequency area is suppressed.

In the first embodiment, the noise for the low frequency area in output signal from the D/A converter 109 is reduced by using the selector 113 and the D/A converter 109 shown in FIG. 3. The output signal from the D/A converter 109 is converted to a frequency nearly equal to the frequency of the input signal Sin by the second frequency converter consisted of the mixer 110 and the reference signal generator 111. In this case, signal neighboring DC (low frequency area) from the D/A converter 109 is converted to the frequency neighboring the input signal Sin. As mentioned-above, the noise neighboring DC of the output signal from the D/A converter 109 is reduced. Therefore, increase of the noise neighboring the signal frequency is reduced and A/D conversion of high accuracy is realized.

Figure 5:
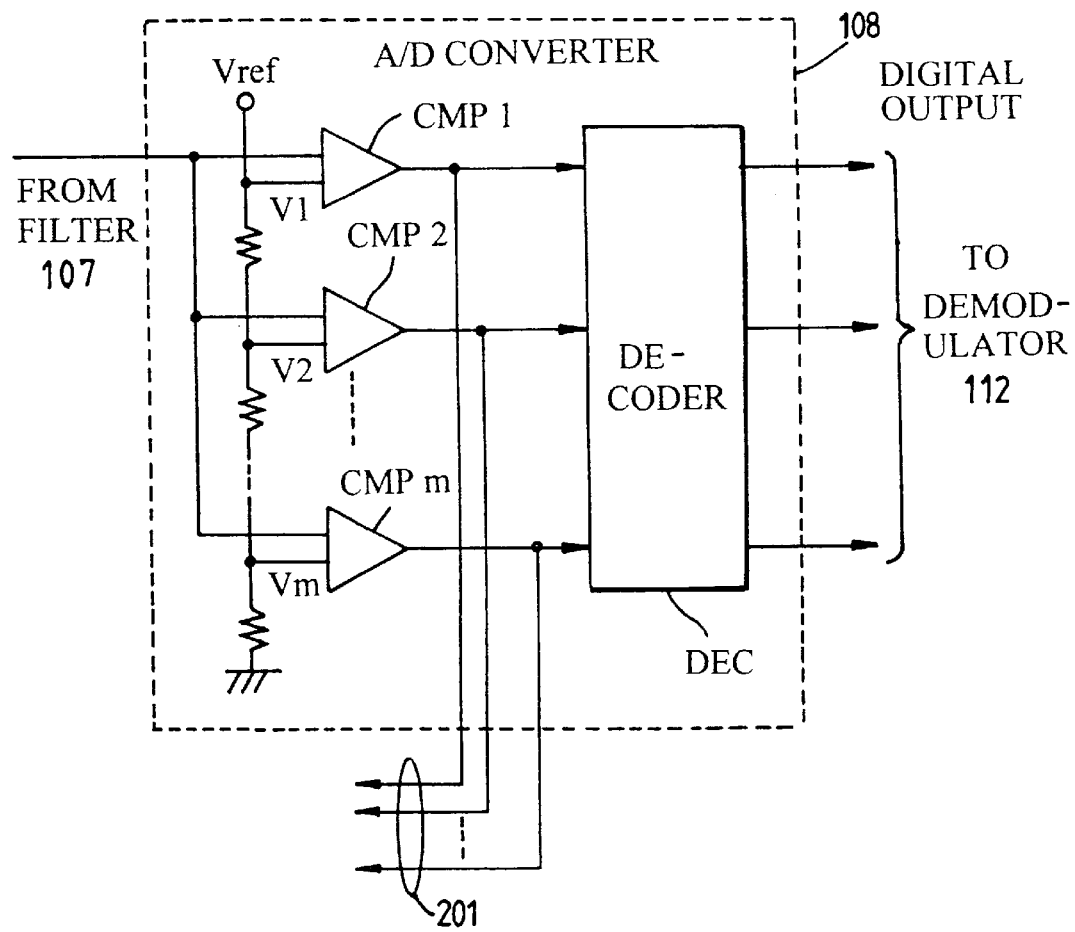
FIG. 5 is a block diagram of the A/D converter in FIG. 2.

FIG. 5 is a block diagram of one example of the A/D converter 108 in FIG. 2. The A/D converter 108 is normal parallel comparison type, consisting of a plurality of comparators CMP1, CMP2, . . . , CMPm to compare the input signal with each reference voltage V1, V2, . . . , Vm, and a decoder DEC to decode the output from each comparator as binary code. The digital signal is extracted from output of the decoder DEC. As the digital signal input 201 to the selector 113, the output from each comparator CMP1, CMP2, . . . , CMPm is used. In this case, the output from each comparator CMP1, CMP2, . . . , CMPm is directly input to the selector 202 in FIG. 3, and it is not necessary that a hardware similar to the decoder DEC is set in the selector 113. In short, the selector 202 determines IN units from the selection signals Xi (i=1~n) in order of lower value of the input signal Int_i (i=1~n) from the filter circuit 210. Therefore, the digital input signal 201 is used as not the binary code but the output from the comparator CMP1, CMP2, . . . , CMPm before decoding. In this case, the decoder is not necessary for the selector 113 and a component of the selector 113 is simple.

Figure 6:
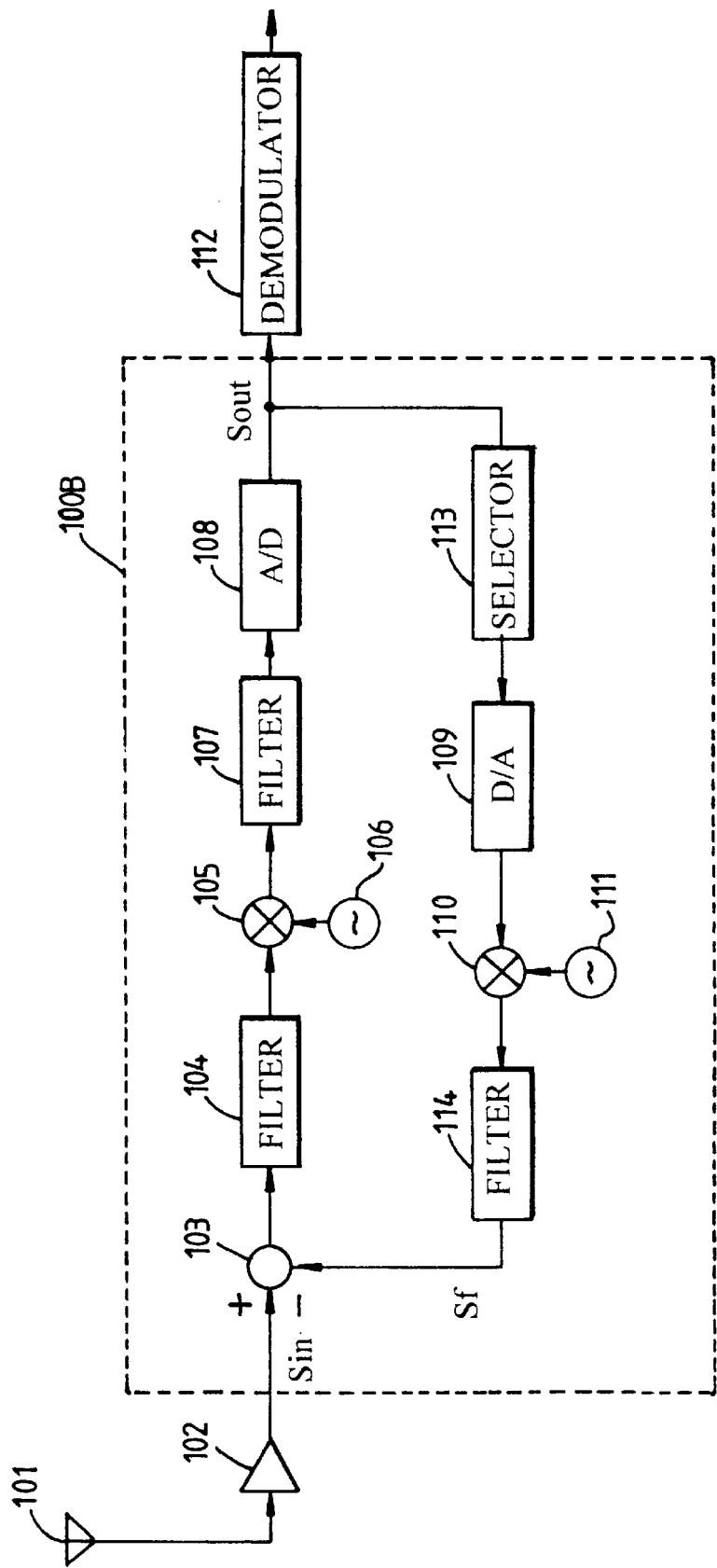
FIG. 6 is a block diagram of an A/D conversion apparatus according to a second embodiment of the present invention.

FIG. 6 is a block diagram of the A/D conversion apparatus in the receiver of the radio apparatus according to a second embodiment. In the second embodiment compared with the first embodiment, output from the mixer 110 is feedbacked to the subtractor 103 through a filter 114. The filter 114 suppresses component except for the frequency of the input signal Sin of the feedback signal Sf. In this way, by adding the filter 114, unnecessary frequency component generated by the second frequency converter or the D/A converter 109 is eliminated by the filter 114 and conversion accuracy goes up. Furthermore, in case of using a harmonic signal such as square wave as a reference signal from the reference signal generator 111, unnecessary signal generated from the harmonic signal is eliminated and falling of the conversion accuracy is prevented.

Figure 7:
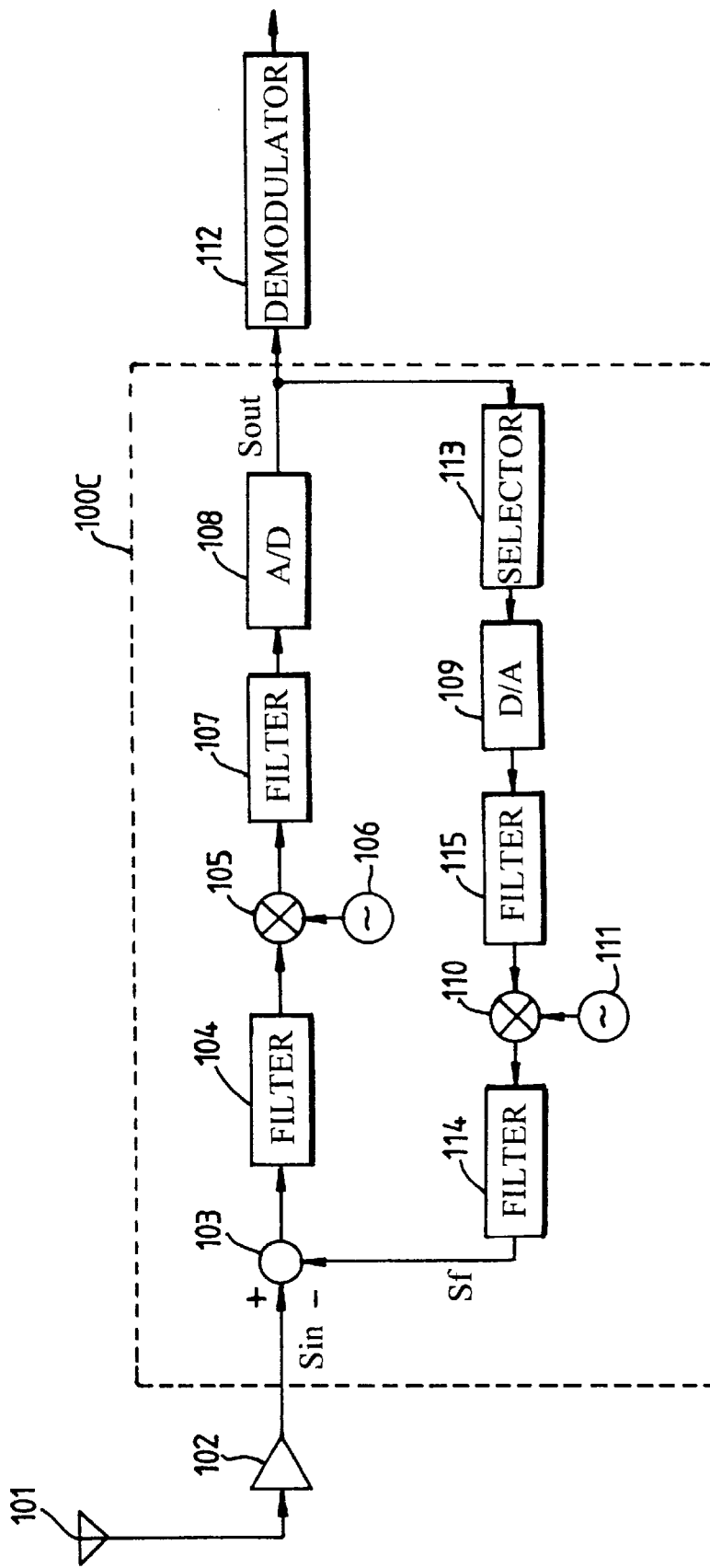
FIG. 7 is a block diagram of an A/D conversion apparatus according to a third embodiment of the present invention.

FIG. 7 is a block diagram of the A/D conversion apparatus in the receiver of the radio apparatus according to a third embodiment. In the third embodiment compared with the second embodiment, a filter 115 is located at the output side of the D/A converter 109. Th e filter 115 eliminates an unnecessary frequency component generated by the D/A converter 109 and alias noise generated at integral number times of clock frequency of the D/A converter 109. As a result, the conversion accuracy goes up.

Figure 8:
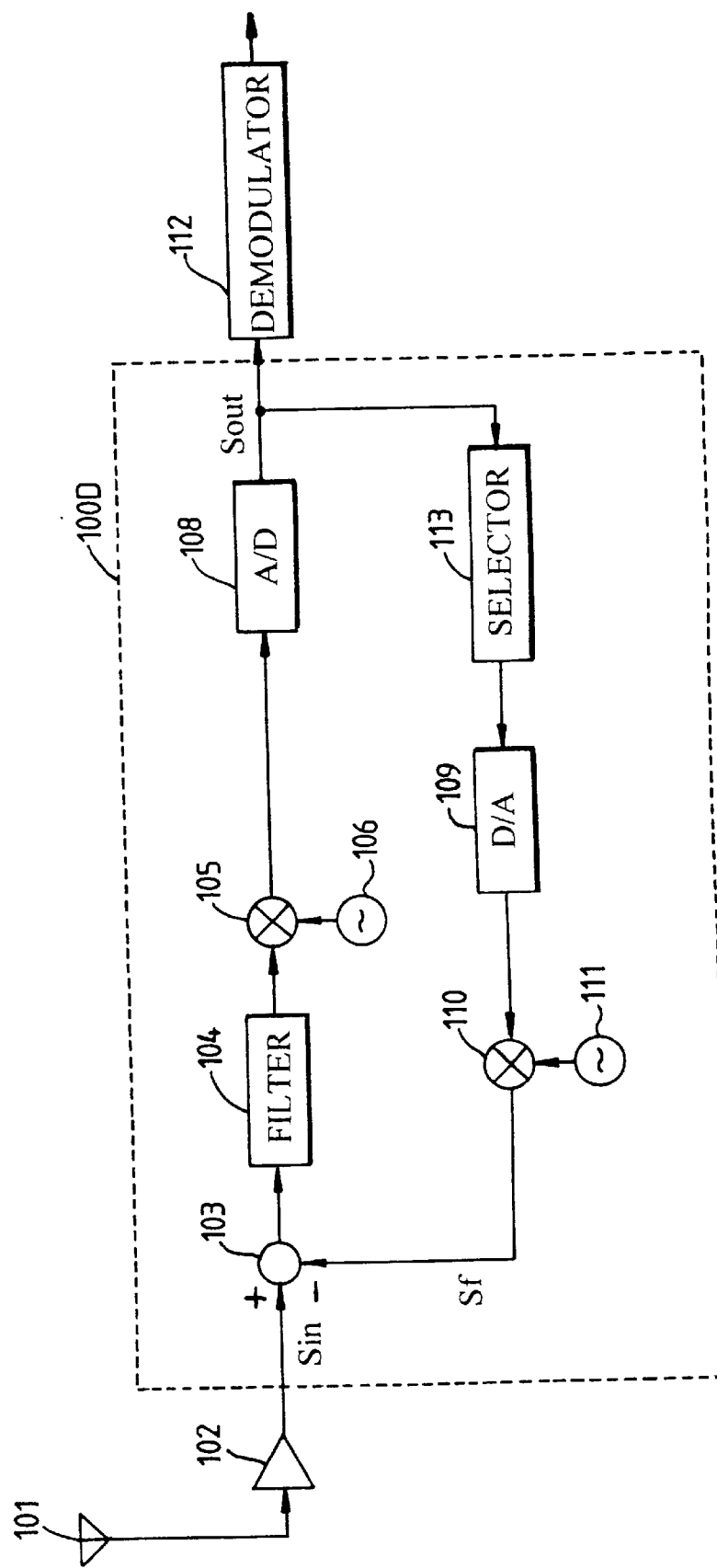
FIG. 8 is a block diagram of an A/D conversion apparatus according to a fourth embodiment of the present invention.

FIG. 8 is a block diagram of the A/D conversion apparatus in the receiver of the radio apparatus according to a fourth embodiment. In the fourth embodiment compared with the first embodiment in FIG. 2, the filter 107 is omitted. If the filter 107 is not located at the output side of the first frequency converter consisting of the mixer 105 and the reference signal generator 106, component (image signal) except for required frequency is input to the A/D converter 108. However, in FIG. 8, the first frequency converter and the A/D converter 108 are located in the feedback loop. Even if noise such as the image signal is input, the noise is suppressed by loop gain and falling of final ability is prevented. Accordingly, the filter 107 is omitted and the circuit scale is reduced.

Figure 9:
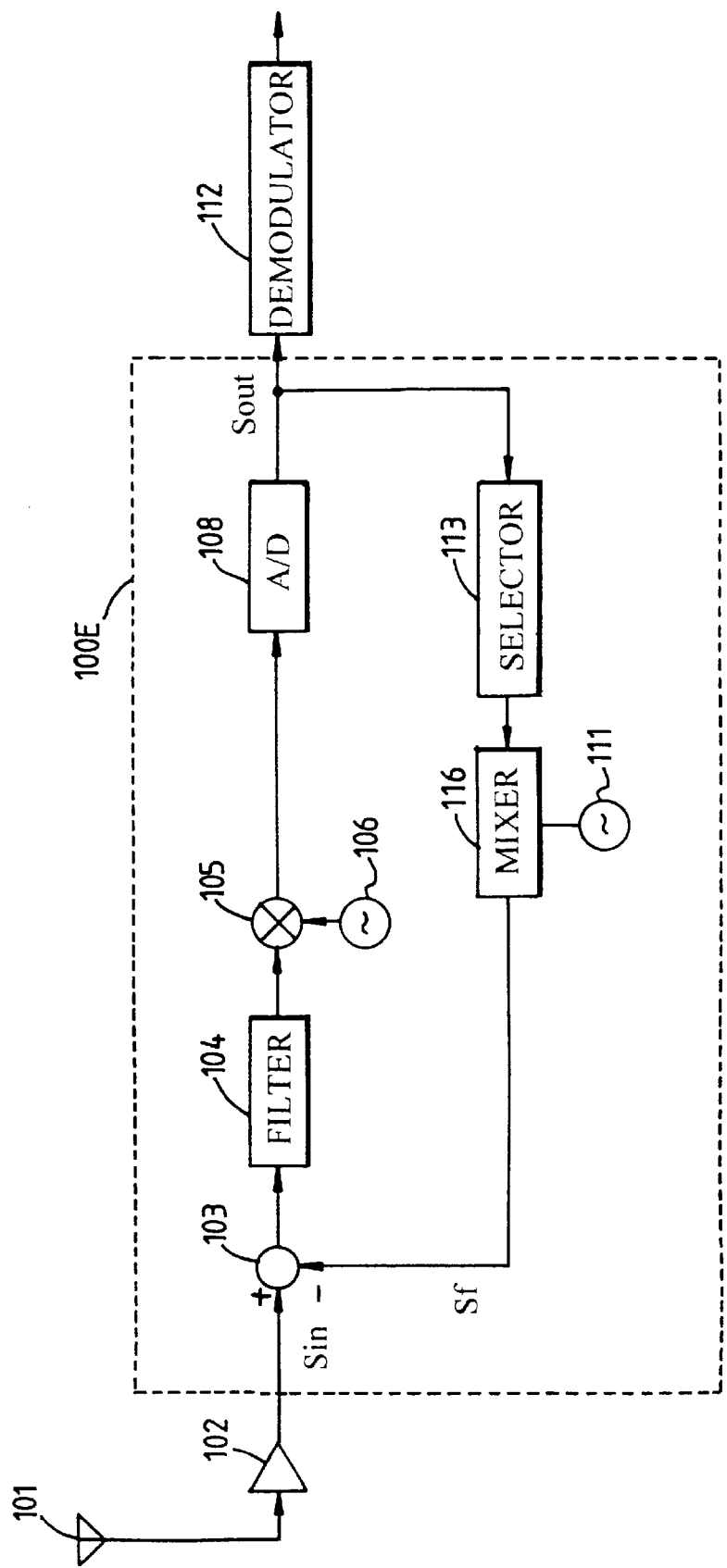
FIG. 9 is a block diagram of an A/D conversion apparatus according to a fifth embodiment of the present invention.

FIG. 9 is a block diagram of the A/D conversion apparatus in the receiver of the radio apparatus according to a fifth embodiment. In comparison with the fourth embodiment, the second frequency converter consisting of the mixer 110 and the reference signal generator 111 is replaced by a digital mixer 116 and conversion elements comprising the digital mixer 116 is selected by the selector 113. In the first~fourth embodiments, the selector 113 selects the conversion elements in the D/A converter 109 only and falling of ability by non ideality of the mixer 110 is prevented. In the fifth embodiment, falling of conversion accuracy affected by dispersion of conversion element in the mixer is also prevented and high accuracy conversion is possible.

Figure 10:
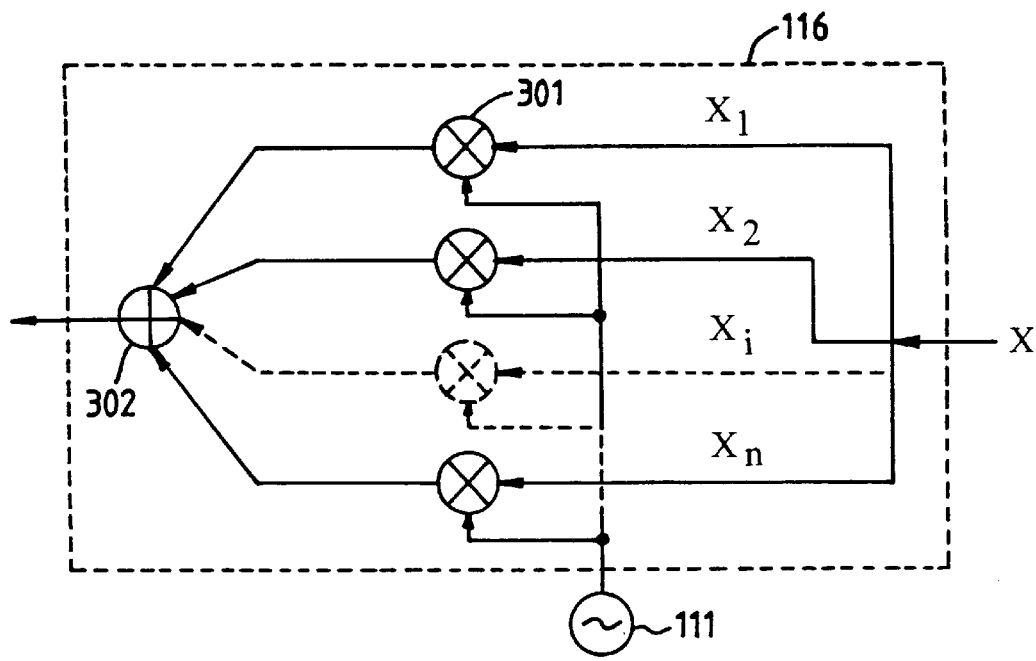
FIG. 10 is a block diagram of the mixer in FIG. 9.

FIG. 10 is a block diagram of the mixer 116 in FIG. 8. The mixer 116 consists of a plurality of multiplexers 301 and an adder 302 f or adding outputs of the plurality of multiplexers 301. In the mixer 116, the multiplexer 301 multiplies the selection signal X1~Xn ("0" or "1") from the selector 113 with the reference signal from the reference signal generator 111, and the adder 302 adds each output from the multiplexer 301. In this way, the mixer 116 outputs a signal in proportion to the output signal from the A/D converter 108. This equals a fact that the output signal from the A/D converter 108 is multiplied with the reference signal from the reference signal generator 111. Furthermore, the multiplexer 301 is selected by the selector 113 and a noise effect by characteristics dispersion for predetermined frequency of the plurality of multiplexers is reduced.

The selection signal Xi is a binary signal "0" or "1" and the multiplexer 301 consists of switch only. In this case, effect of non ideality such as non linearity for the mixer 116 is eliminated. Accordingly, effect of the non ideality of the mixer is suppressed and the high accuracy conversion is possible.

Figure 11:
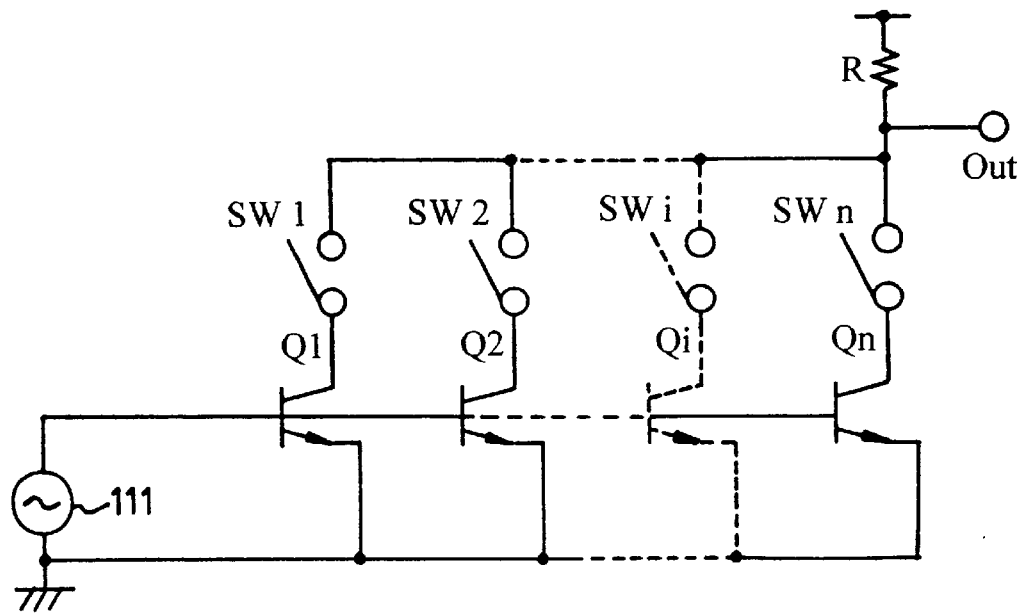
FIG. 11 is a detail diagram of the mixer in FIG. 10.

FIG. 11 is a detailed block diagram of the mixer 116. In FIG. 11, a reference signal from the reference signal generator 111 is input to a base of transistor Q1~Qn. Each emitter of the transistor Q1~Qn is commonly connected to a reference electric potential point and each collector of transistor Q1~Qn is connected to one side of a plurality of switches SW1~Swn. The other side of the switches SW1~Swn is commonly connected and the common connection point is connected to a power supply through a resistance R. The output is extracted from the common connection point.

In FIG. 10, the multiplexer 301 consists of the transistors Q1~Qn and the switches SW1~SWn, and the adder 302 is realized by connection. "On" and "Off"of the switches SW1~Swn are controlled by the selection signal from the selector 113 in FIG. 9. In the collector of the transistors Q1~Qn, the reference signal from the reference signal generator 111 flows. A current value of each collector is equal if characteristics of the transistor Q1~Qn is perfectly the same. Actually, the characteristics are not perfectly the same because of dispersion of manufactural accuracy. Accordingly, "On" and "Off" of the switches SW1~SWn is simply controlled by digital signal from the A/D converter 108, conversion error is included in output by current error for this dispersion. In the fifth embodiment, the switches SW1~SWn are controlled by the selection signal from the selector 113 and noise effect of predetermined frequency is greatly reduced. In short, it is not necessary that characteristics of the transistors Q1~Qn be perfectly the same. As a result, an inexpensive semiconductor process is utilized and the cost is also reduced.

Figure 12:
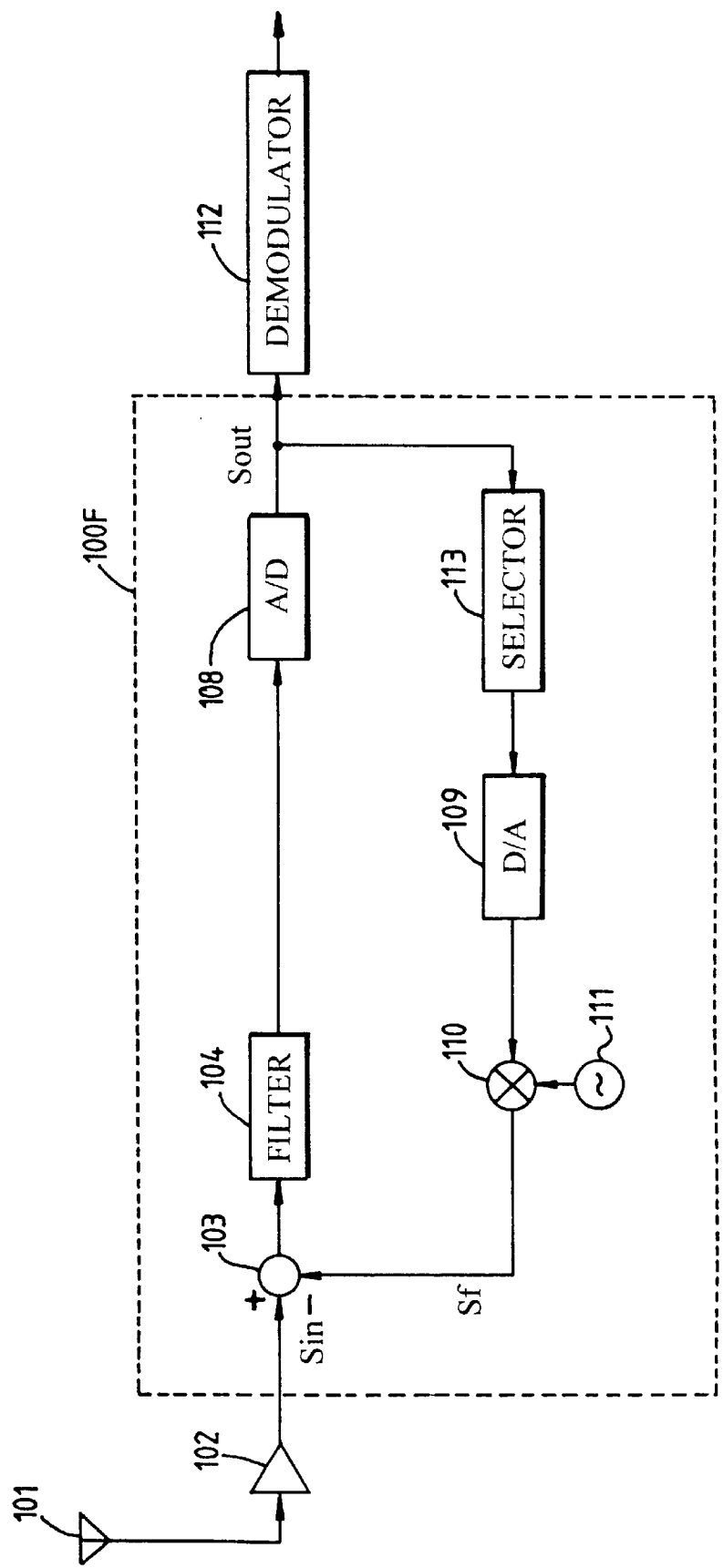
FIG. 12 is a block diagram of an A/D conversion apparatus according to a sixth embodiment of the present invention.

FIG. 12 is a block diagram of the A/D conversion apparatus in the receiver of the radio apparatus according to a sixth embodiment. In comparison with the fourth embodiment in FIG. 8, the first frequency converter is omitted and sampling function of the A/D converter 108 unites a function of the first frequency converter. In order to unite the function of the first frequency converter for the A/D converter 108, the sampling frequency of the A/D converter 108 is set less than two times the carrier frequency of the input signal. Furthermore, the filter 104 includes a bandpass filter to pass the frequency component for the career frequency of the input signal. As well-known, if sampling is executed for the A/D converter by frequency below the frequency of the input signal, the input signal is folded by bandwidth of frequency below a half of the sampling frequency. Therefore, if the sampling frequency is set to an adequate frequency less than two times the carrier frequency within non-folded range of sideband component, the frequency of the input signal is converted to a lower frequency as alias component of the A/D converter 108. In this way, in the sixth embodiment, the function of the first frequency converter is united to the A/D converter 108, and the hardware scale and the cost are reduced. Furthermore, the sampling frequency is set low and consumption of electric power is also reduced.

Figure 13:
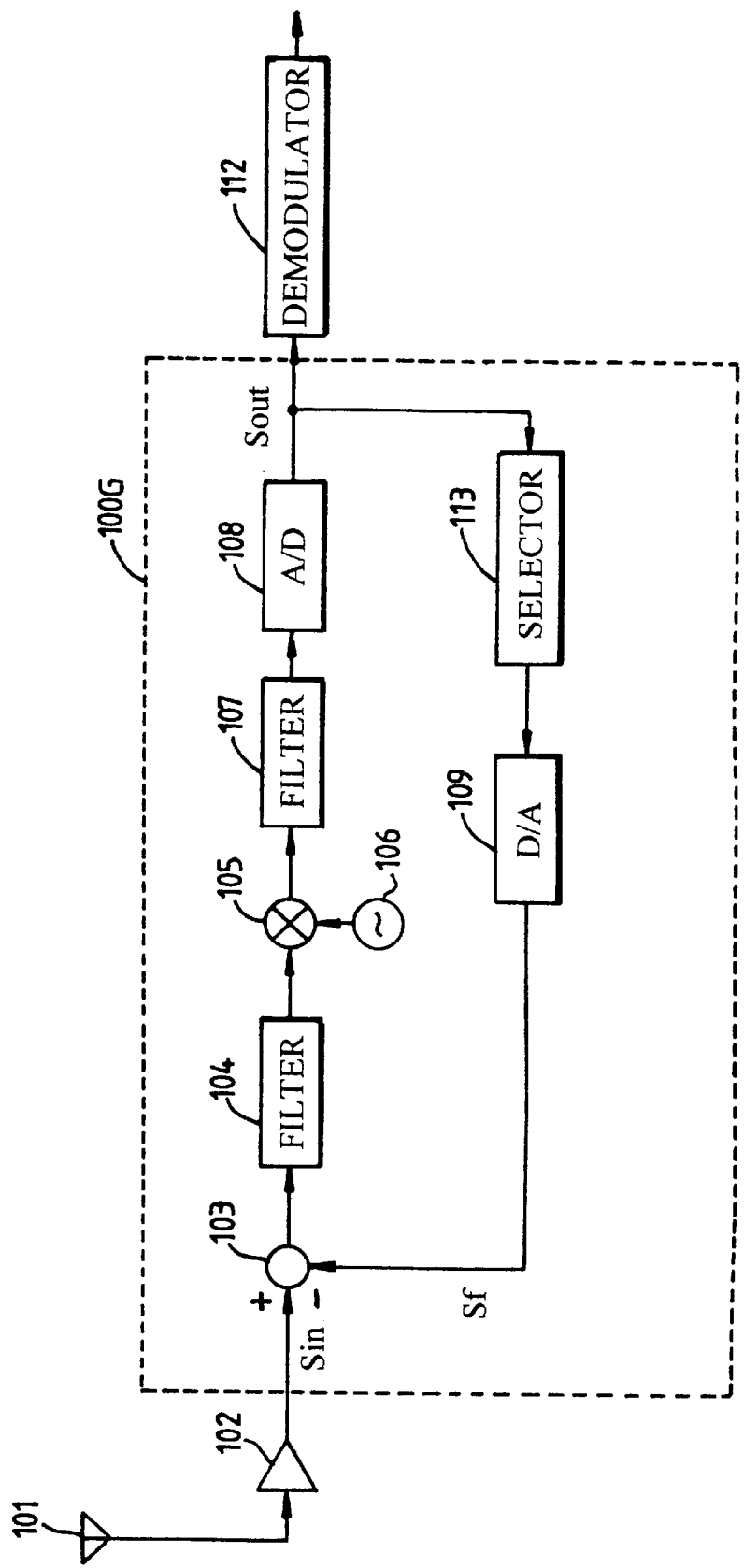
FIG. 13 is a block diagram of an A/D conversion apparatus according to a seventh embodiment of the present invention.

FIG. 13 is a block diagram of the A/D conversion apparatus in the receiver of the radio apparatus according to a seventh embodiment. In comparison with the fourth embodiment in FIG. 8, the second frequency converter is omitted and the D/A converter 109 includes the function of the second frequency converter. In the seventh embodiment, output of the D/A converter 109 is realized by zero order hold. In other words, output section does not include a lowpass filter different from normal D/A converter. In this case, the output of the D/A converter 109 is an analog signal of square wave (staircase) and includes frequency component of integral number times of the sampling frequency. Accordingly, if the frequency component equal to the frequency of the input signal in the output from the D/A converter 109 is used as the feedback signal Sf, the second frequency converter is omitted. Furthermore, if a pulse width of the output from the D/A converter 109 is set narrow, energy of the harmonic component is large and it is useful for the D/A converter 109 to unite the function of the second frequency converter. In this way, in the seventh embodiment, the function of the second frequency converter is united to output section of the D/A converter 109, and the hardware scale and the cost are reduced.

Figure 14:
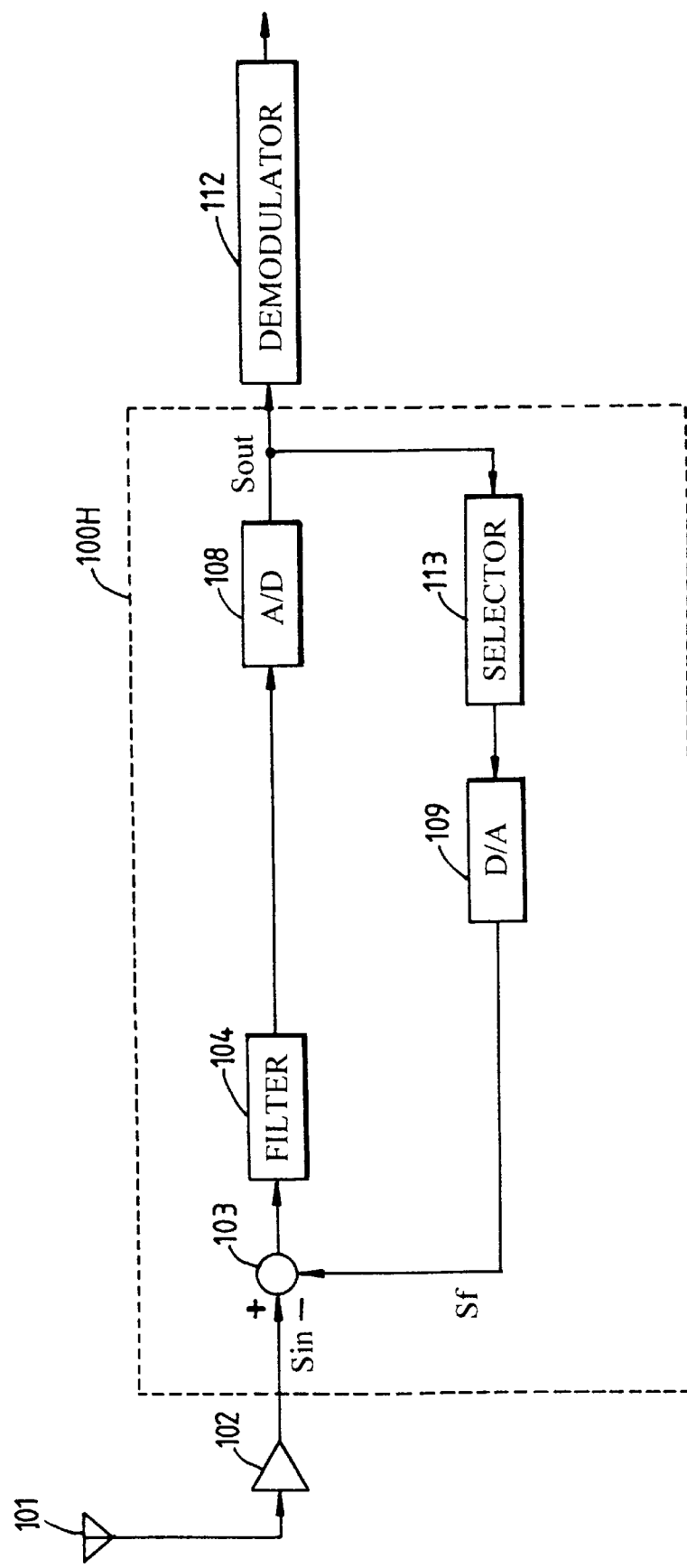
FIG. 14 is a block diagram of an A/D conversion apparatus according to an eighth embodiment of the present invention.

FIG. 14 is a block diagram of the A/D conversion apparatus in the receiver of the radio apparatus according to an eighth embodiment. In the eighth embodiment, the sixth embodiment uniting the first frequency converter to the A/D converter 108 in FIG. 12 is combined with the seventh embodiment uniting the second frequency converter to the D/A converter 109 in FIG. 13. Accordingly, special hardware of the first frequency converter and the second frequency converter is not necessary, and the hardware scale is greatly reduced.

Figure 15:
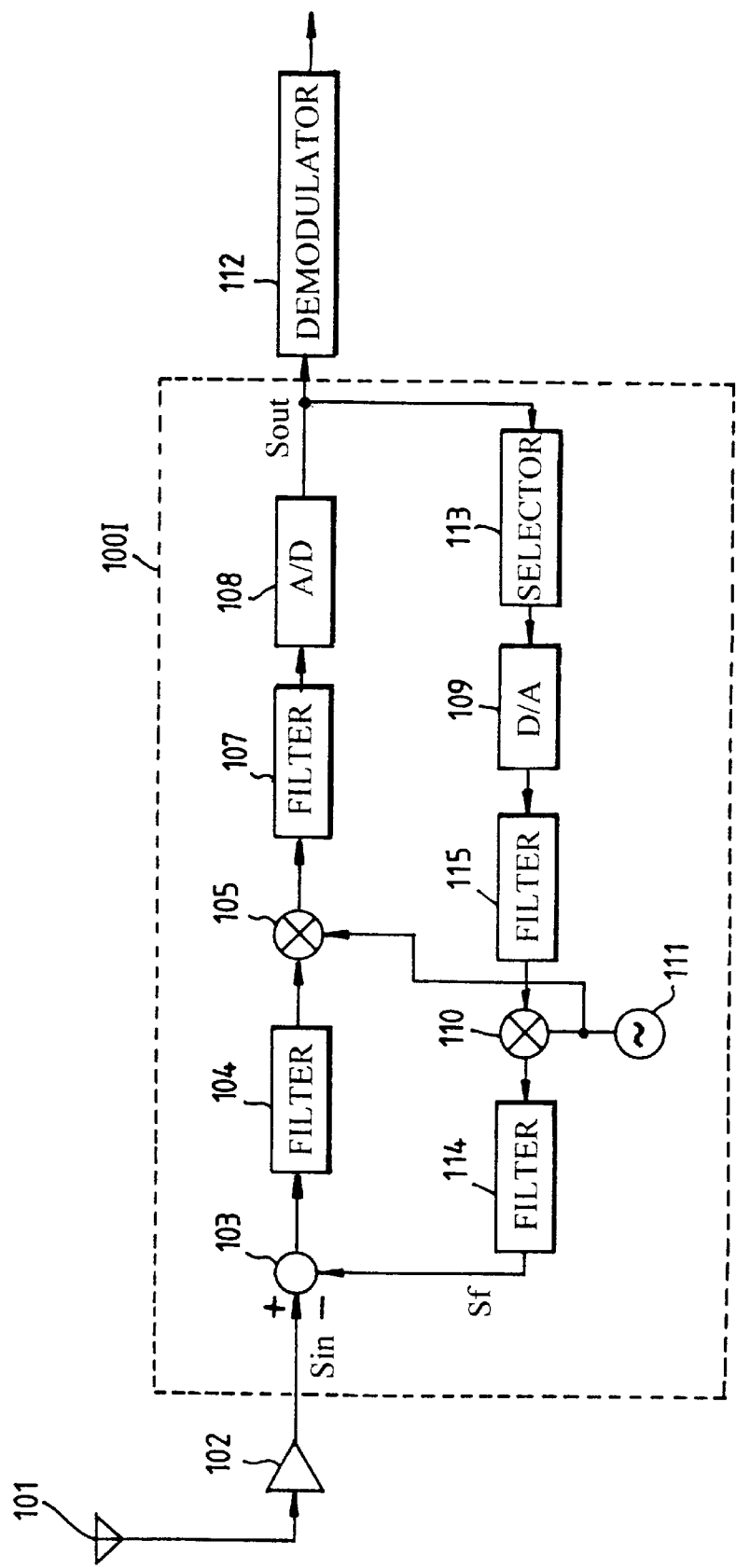
FIG. 15 is a block diagram of an A/D conversion apparatus according to a ninth embodiment of the present invention.

FIG. 15 is a block diagram of the A/D conversion apparatus in the receiver of the radio apparatus according to the ninth embodiment. In comparison with the first embodiment in FIG. 2, the reference signal generator 106 and the reference signal generator 111 are commonly used. In the first–eighth embodiments, if the output frequency of the reference signal generator 106 is different from that of the reference signal generator 111, the frequency of the feedback signal Sf does not coincide with the frequency of the input signal Sin and a loop is often unstable. However, in the ninth embodiment, this situation is avoided because the reference signal generator 106 and the reference signal generator 111 are commonly used. Furthermore, the hardware scale is reduced and the consumption of electric power is reduced because the reference signal generator is united as one means.

Figure 16:
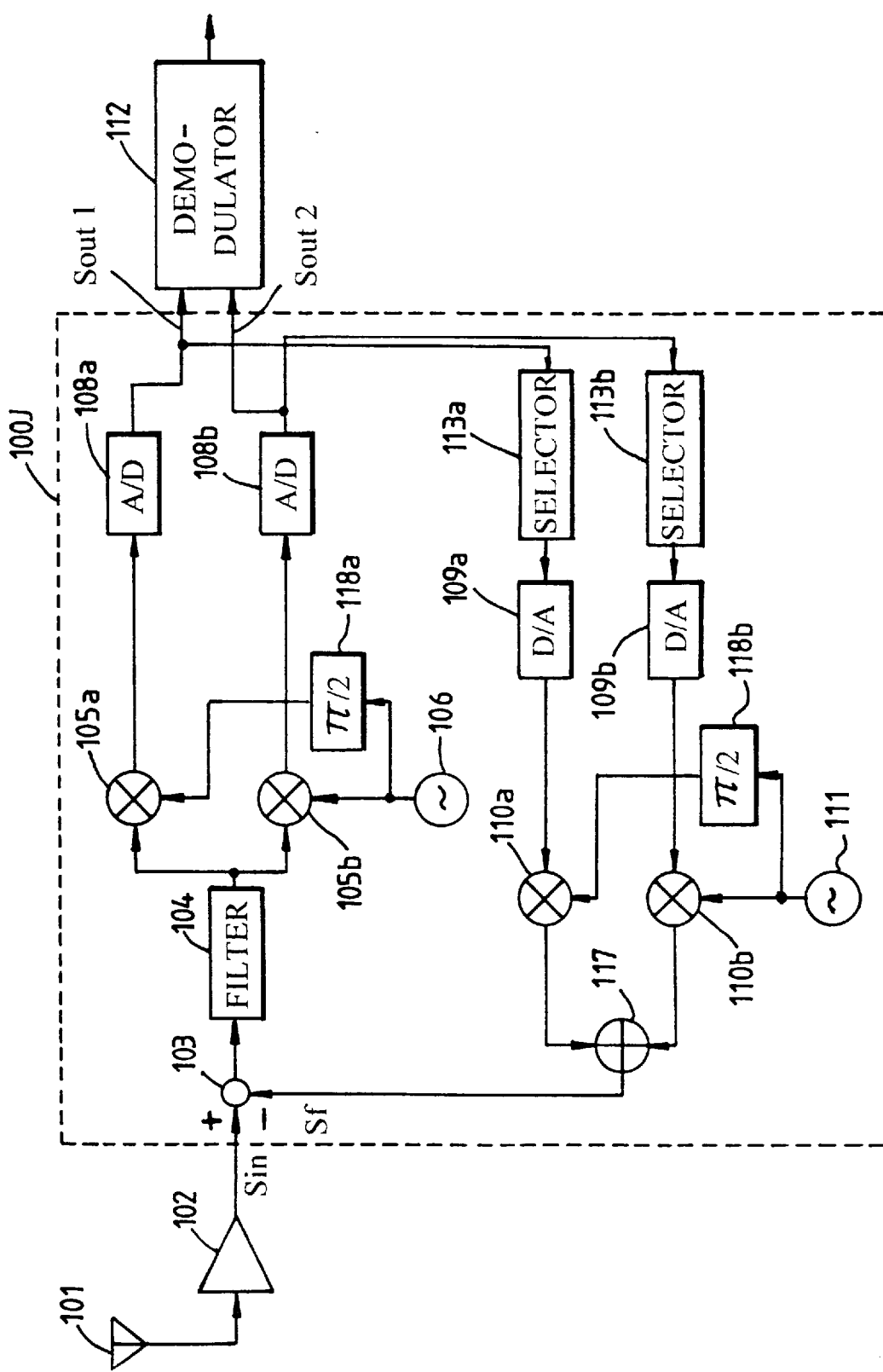
FIG. 16 is a block diagram of an A/D conversion apparatus according to a tenth embodiment of the present invention.

FIG. 16 is a block diagram of the A/D conversion apparatus in the receiver of the radio apparatus according to a tenth embodiment. In the tenth embodiment, an orthogonal frequency converter is used as the first converter and the second converter.

A first orthogonal frequency converter consists of two mixers 105a and 105b to respectively input the output signal from the filter 104, the reference signal generator 106 to output the reference signal to the mixers 105a and 105b, and $\pi/2$ phase shifter 118a to shift one reference signal by $\pi/2$. The first orthogonal frequency converter outputs two frequency conversion signals orthogonal to each other.

In the tenth embodiment, two A/D converters and two D/A converters are prepared. In FIG. 16, output from the two mixers 105a and 105b are respectively input to two A/D converters 108a and 108b. The output from the A/D converters 108a and 108b are respectively extracted as A/D conversion outputs Sout1 and Sout2 orthogonal to each other, and respectively input to the two D/A converters 109a and 109b through two selectors 113a and 113b.

The second frequency converter consists of two mixers 110a and 110b to respectively input the output signals from the DA converters 109a and 109b, the reference signal generator 111 to output the reference signal to the two mixers 110a and 11b37π/2 ,phase shifter 118b to shift one reference signal as $\pi/2$, and an adder 117 to add the output from the two mixers 110a and 110b. An output from the adder 117 is supplied to the subtractor 103 as the feedback signal Sf.

In the tenth embodiment, an effect similar to the first embodiment is obtained. In short, the first frequency converter consisting of the two mixers 105a and 105b, the reference signal generator 106, and the $\pi/2$ phase shifter 118a is located in the main signal path of negative feedback loop. Therefore, the effect of less than perfect operation of the mixers 105a and 105b is reduced by operation of the negative feedback. Furthermore, the D/A converters 109a and 109b are located in a feedback signal path of the negative feedback loop, and excellent characteristics of low distortion and low noise is required for the two D/A converters 109a and 109b. In this case, the selectors 113a and 113b respectively select the conversion elements in the D/A converters 109a and 109b, and the distortion and the noise generated by dispersion of the conversion elements are reduced in bandwidth of the predetermined frequency. Therefore, the low distortion and the low noise are easily realized.

Furthermore, in the tenth embodiment, a frequency of the reference signal supplied from the reference signal generator 106 to the mixers 105a and 105b, and a frequency of the reference signal supplied from the reference signal generator 111 to the mixers 110a and 11b are arbitrarily selected. If the frequency of the reference signal is equal to the carrier frequency of the input signal, the input signal is converted to the baseband signal by the mixers 105a and 105b. In the first embodiment shown in FIG. 2, if the frequency of the reference signal is selected in this way, both sidebands of the input signal are folded to the baseband by the mixer 105, one of the amplitude components and phase components of the input signal is not demodulated. However, in the tenth embodiment, the orthogonal frequency converter is used as the first frequency converter. Therefore, both the amplitude component and the phase component are converted by the orthogonal frequency converter and demodulated by the A/D converter 108 and the demodulator 112.

Figure 17:
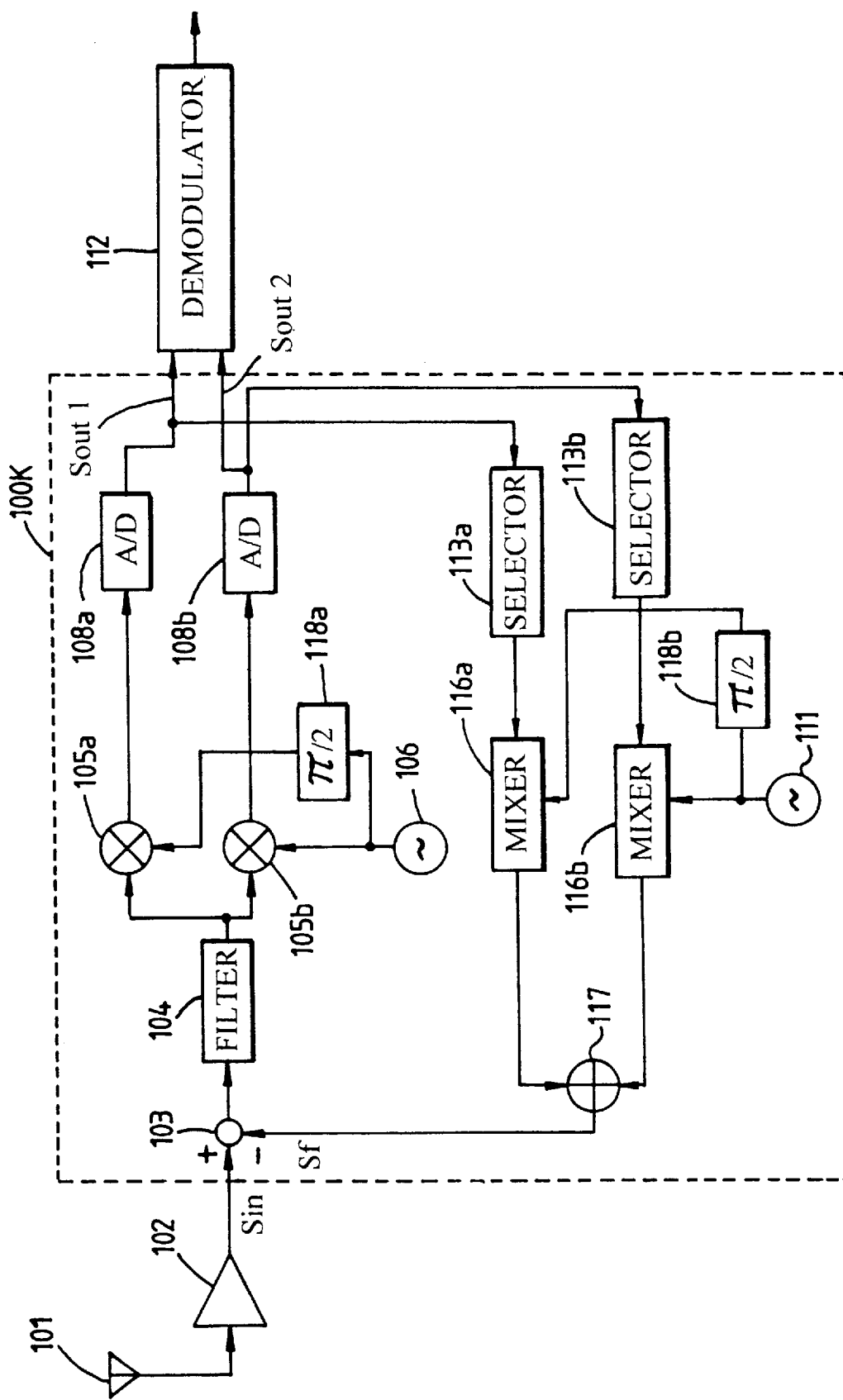
FIG. 17 is a block diagram of an A/D conversion apparatus according to an eleventh embodiment of the present invention.

FIG. 17 is a block diagram of the A/D conversion apparatus in the receiver of the radio apparatus according to an eleventh embodiment. In the eleventh embodiment, the fifth embodiment shown in FIG. 9 is modified as an orthogonal type. In comparison with the tenth embodiment, the digital mixers 116a and 116b respectively correspond to the mixer 110a and the D/A converter 109a, the mixer 110b and the D/A converter 109b. The conversion elements in the digital mixers 116a and 116b are respectively selected by the selectors 113*a* and 113*b*. In the tenth embodiment, the selector 113*a* and 113*b* respectively selects the conversion elements in the D/A converter 109*a* and 109*b*. Therefore, the ability falls because of non ideality of the mixers 110*a* and 11*b*. However, in the eleventh embodiment, falling of conversion accuracy by effect of dispersion of elements consisting of the mixer is also prevented and high accuracy conversion is possible.

Figure 18:
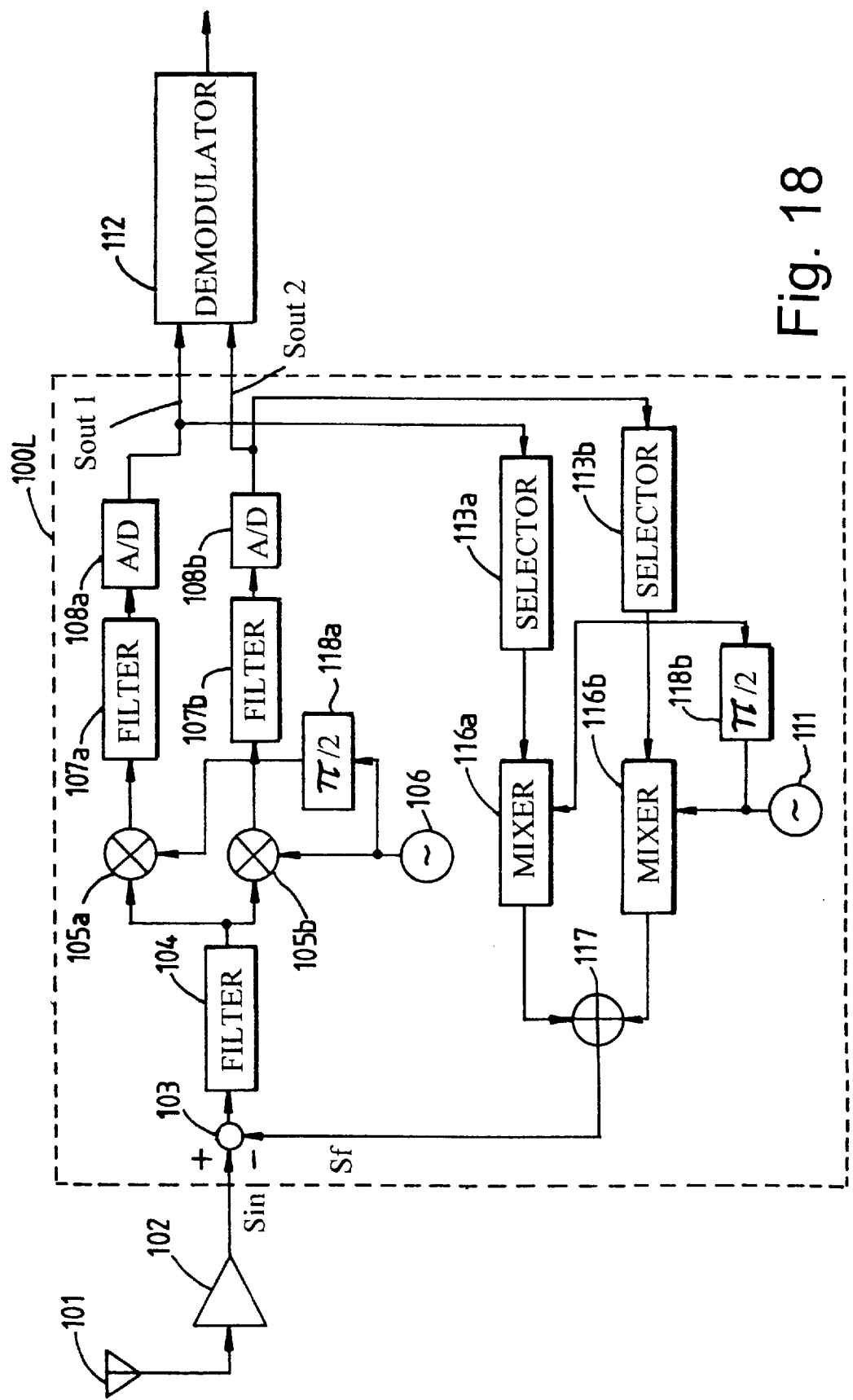
FIG. 18 is a block diagram of an A/D conversion apparatus according to a twelfth embodiment of the present invention.

FIG. 18 is a block diagram of the A/D conversion apparatus in the receiver of the radio apparatus according to a twelfth embodiment. In comparison with the eleventh embodiment in FIG. 17, two filters 107*a* and 107*b* are respectively located at the output side of the mixers 105*a* and 105*b* in the first orthogonal frequency converter. In the twelfth embodiment, an unnecessary frequency component (image signal) generated by the mixers 105*a* and 105*b* is respectively eliminated by the filters 107*a* and 107*b*. As a result, falling of the conversion accuracy is prevented.

Figure 19:
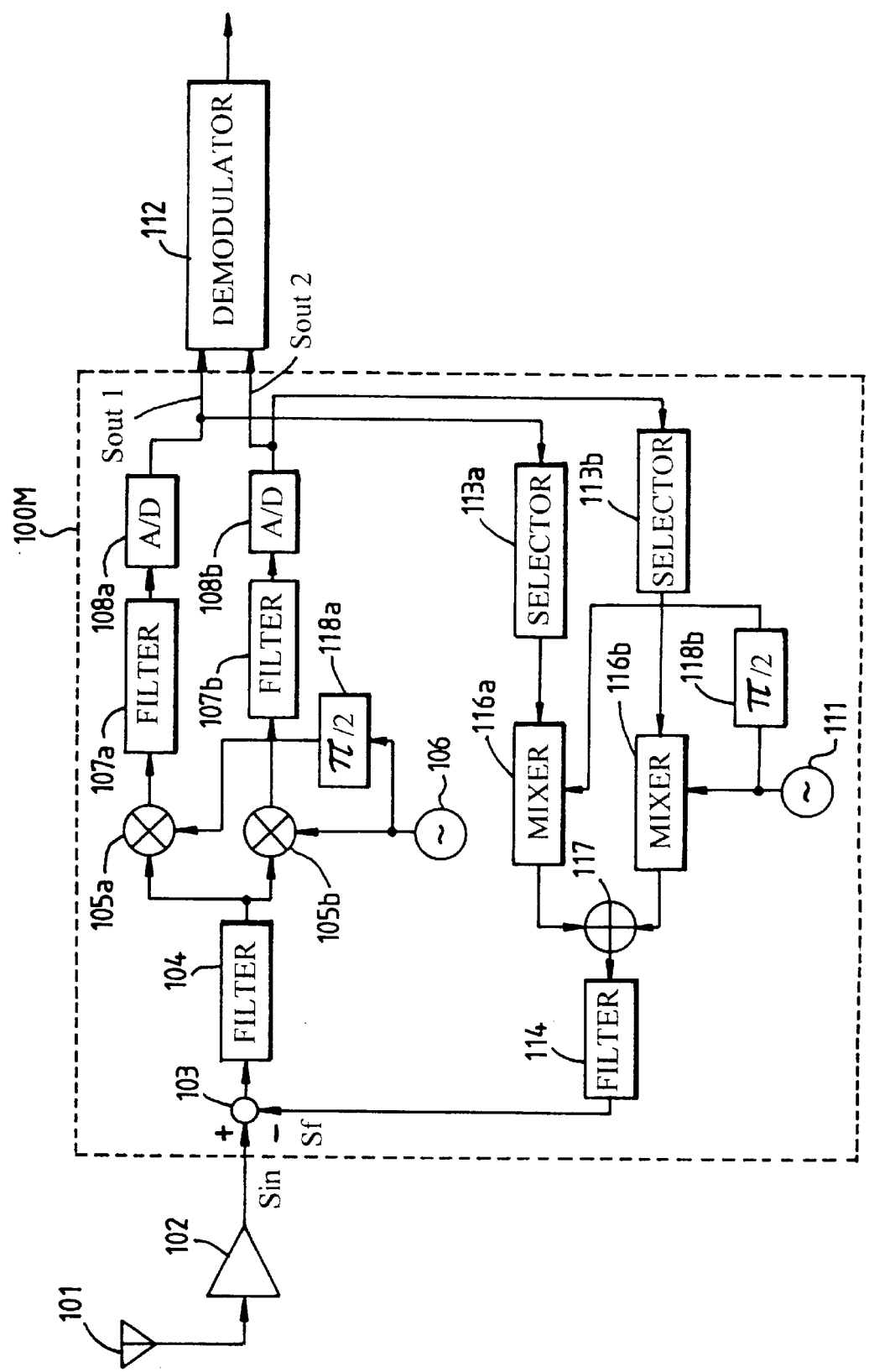
FIG. 19 is a block diagram of an A/D conversion apparatus according to a thirteenth embodiment of the present invention.

FIG. 19 is a block diagram of the A/D conversion apparatus in receiver of the radio apparatus according to a thirteenth embodiment. In comparison with the twelfth embodiment in FIG. 18, a filter 114 is located at the output side of the adder 117. In the thirteenth embodiment, an unnecessary frequency component generated by the second orthogonal frequency converter or the D/A converter is eliminated by the filter 114, and the conversion accuracy goes up. Furthermore, in case the harmonic component such as a square wave is used as the reference signal of the reference signal generator 111, the unnecessary signal generated by the harmonic component is eliminated and falling of the conversion accuracy is prevented.

Figure 20:
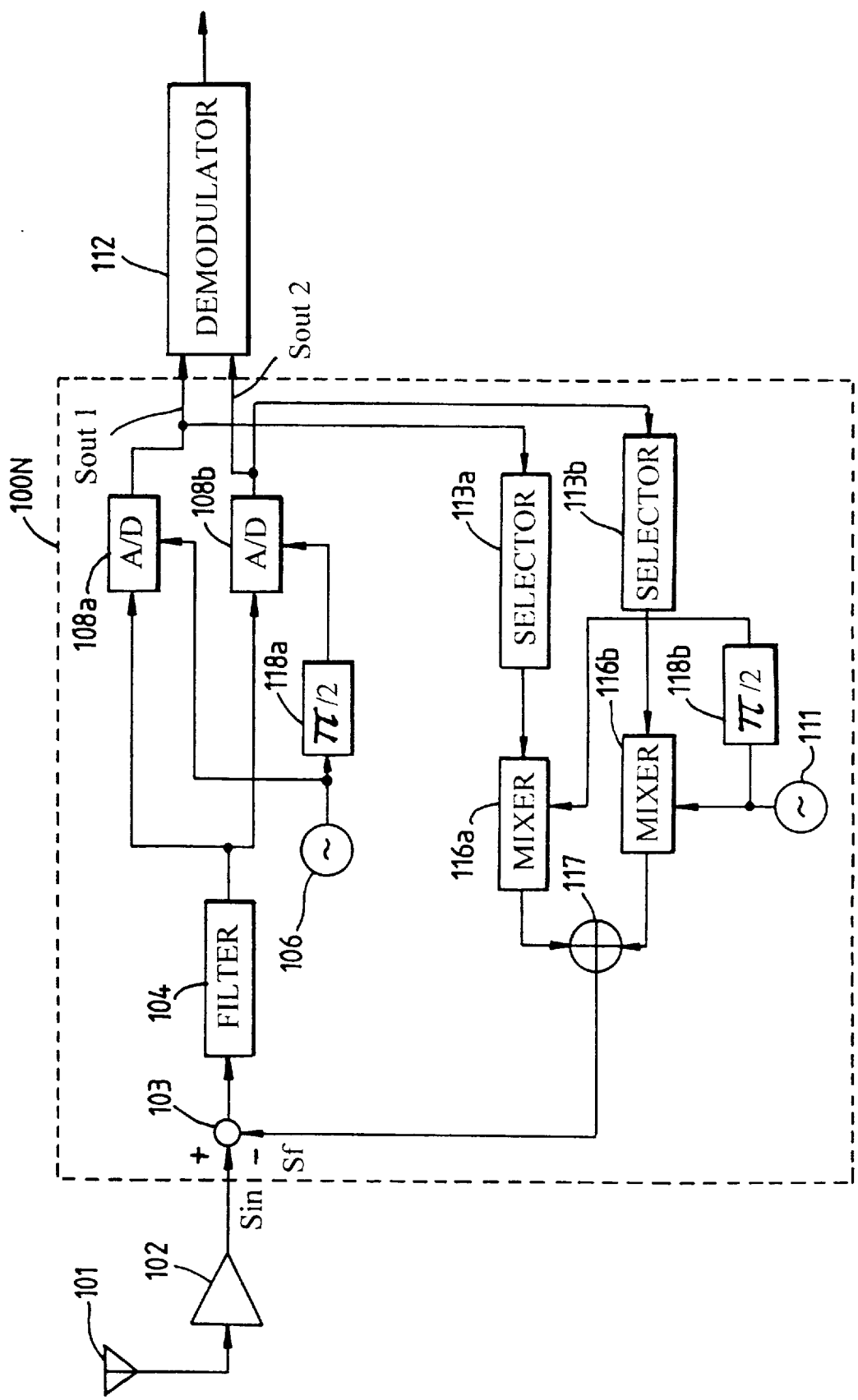
FIG. 20 is a block diagram of an A/D conversion apparatus according to a fourteenth embodiment of the present invention.

FIG. 20 is a block diagram of the A/D conversion apparatus in the receiver of the radio apparatus according to the fourteenth embodiment. In comparison with the eleventh embodiment in FIG. 16, the first orthogonal frequency converter is omitted, and the function of the first orthogonal frequency converter is unified with the sampling function of two A/D converters 108*a* and 108*b*.

In order to realize the conversion function of the orthogonal frequency by the sampling function of the two A/D converters 108*a* and 108*b*, clock signals having a 90° ($\pi/2$) phase difference are generated by the reference signal generator 106 and the phase shifter 118*a*, and the sampling is executed by the clock signals. Furthermore, in order for the A/D converter 108*a* and 108*b* to prepare the function of the first orthogonal frequency converter, the sampling frequency of the A/D converters 108*a* and 108*b* is set to less than two times the carrier frequency of the input signal. As the filter 104, the bandpass filter to pass the frequency component for the career frequency of the input signal is used. In this way, in the fourteenth embodiment, the function of the first orthogonal frequency converter is united with the A/D converters 108*a* and 108*b*. Therefore, the hardware scale and the cost are reduced. In addition to this, the consumption of electric power is also reduced because the sampling frequency is set low.

Figure 21:
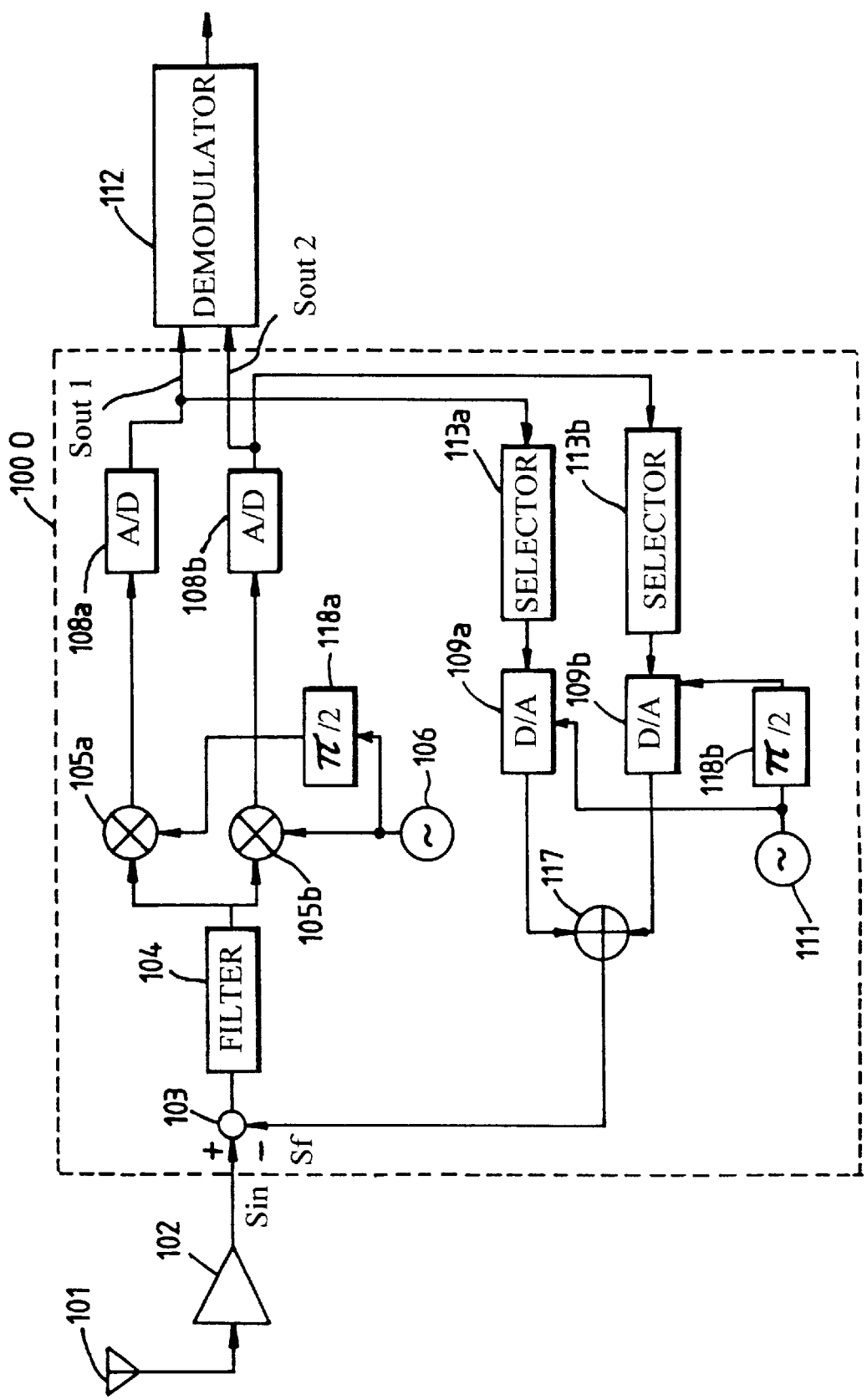
FIG. 21 is a block diagram of an A/D conversion apparatus according to a fifteenth embodiment of the present invention.

FIG. 21 is a block diagram of the A/D conversion apparatus in the receiver of the radio apparatus according to a fifteenth embodiment. In comparison with the tenth embodiment in FIG. 15, the second orthogonal frequency converter is omitted and the function of the second orthogonal frequency converter is united with the two D/A converters 109*a* and 109*b*.

In the fifteenth embodiment, output from the D/A converters 109*a* and 109*b* is realized as zero order hold. In other words, the output section does not include a lowpass filter for smoothing, different from a normal D/A converter. In this case, output from the D/A converter 109*a* and 109*b* is an analog signal of square wave (staircase), and includes the harmonic component, i.e., frequency component of integral number times of the sampling frequency. Accordingly, if a frequency component equal to the frequency of the input signal is used as the feedback signal Sf in the output of the D/A converters 109*a* and 109*b*, the second orthogonal frequency converter may be omitted. Furthermore, in order to convert the orthogonal signal from the two A/D converters 108*a* and 108*b*, two clock signals from the two D/A converters 109*a* and 109*b* includes the phase difference "90°" by the reference signal generator 111 and the phase shifter 118*b*. Furthermore, if a pulse width of the output from the D/A converters 109*a* and 109*b* is narrow, energy of the harmonic component is large. Therefore, it is useful for the D/A converters 109*a* and 109*b* to prepare the function of the second frequency converter. In this way, in the fifteenth embodiment, the function of the second orthogonal frequency converter is unified with output section of the D/A converter 109*a* and 109*b*. As a result, the hardware scale and the cost are reduced.

Figure 22:
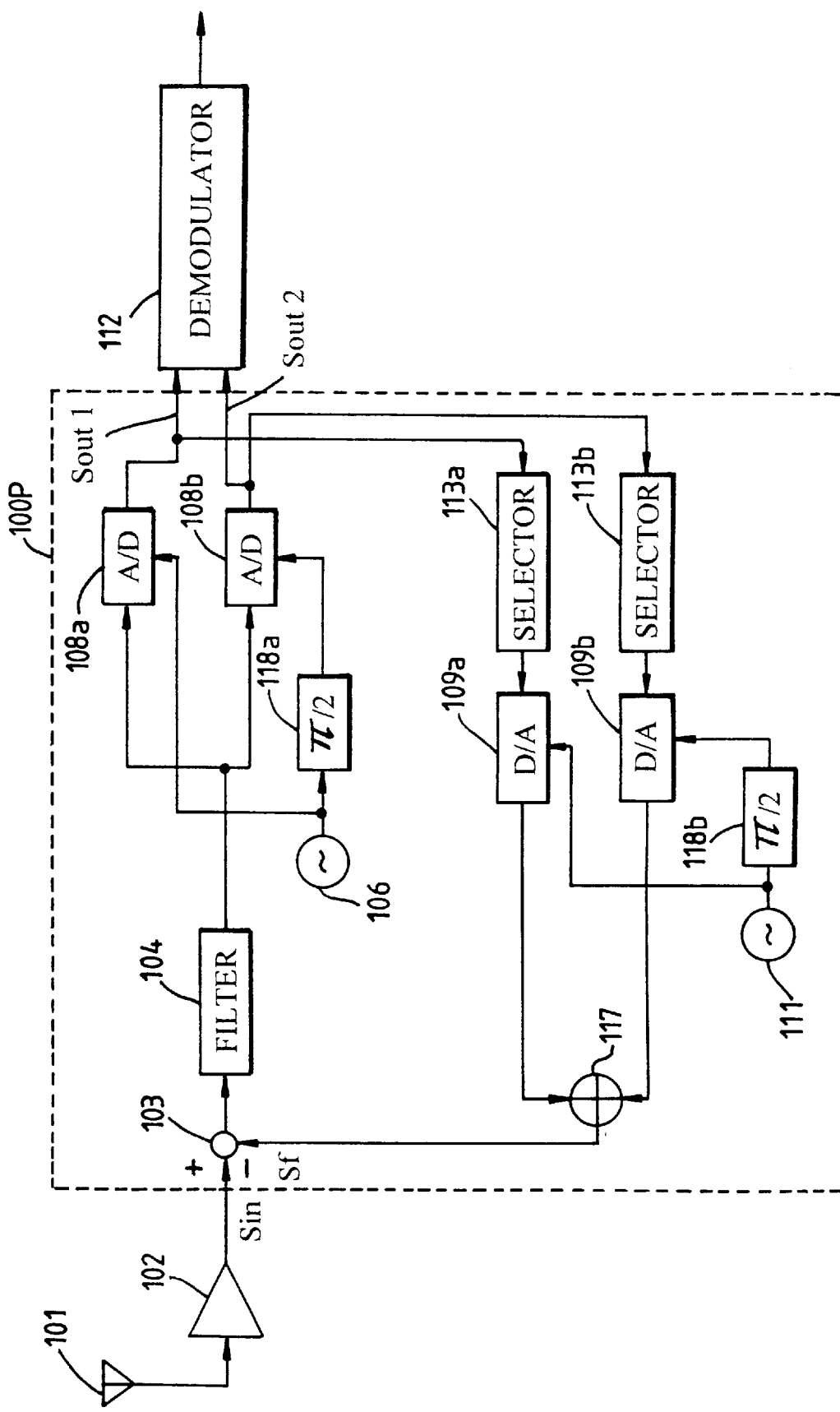
FIG. 22 is a block diagram of an A/D conversion apparatus according to a sixteenth embodiment of the present invention.

FIG. 22 is a block diagram of the A/D conversion apparatus in the receiver of the radio apparatus according to a sixteenth embodiment. In the sixteenth embodiment, the fourteenth embodiment uniting the function of the first frequency converter with the A/D converters 108*a* and 108*b* in FIG. 20 is combined with the fifteenth embodiment uniting the function of the second frequency converter with the D/A converters 109*a* and 109*b* in FIG. 21. In this case, special hardware as the first frequency converter and the second frequency converter is not necessary, and the hardware scale is greatly reduced.

Figure 23:
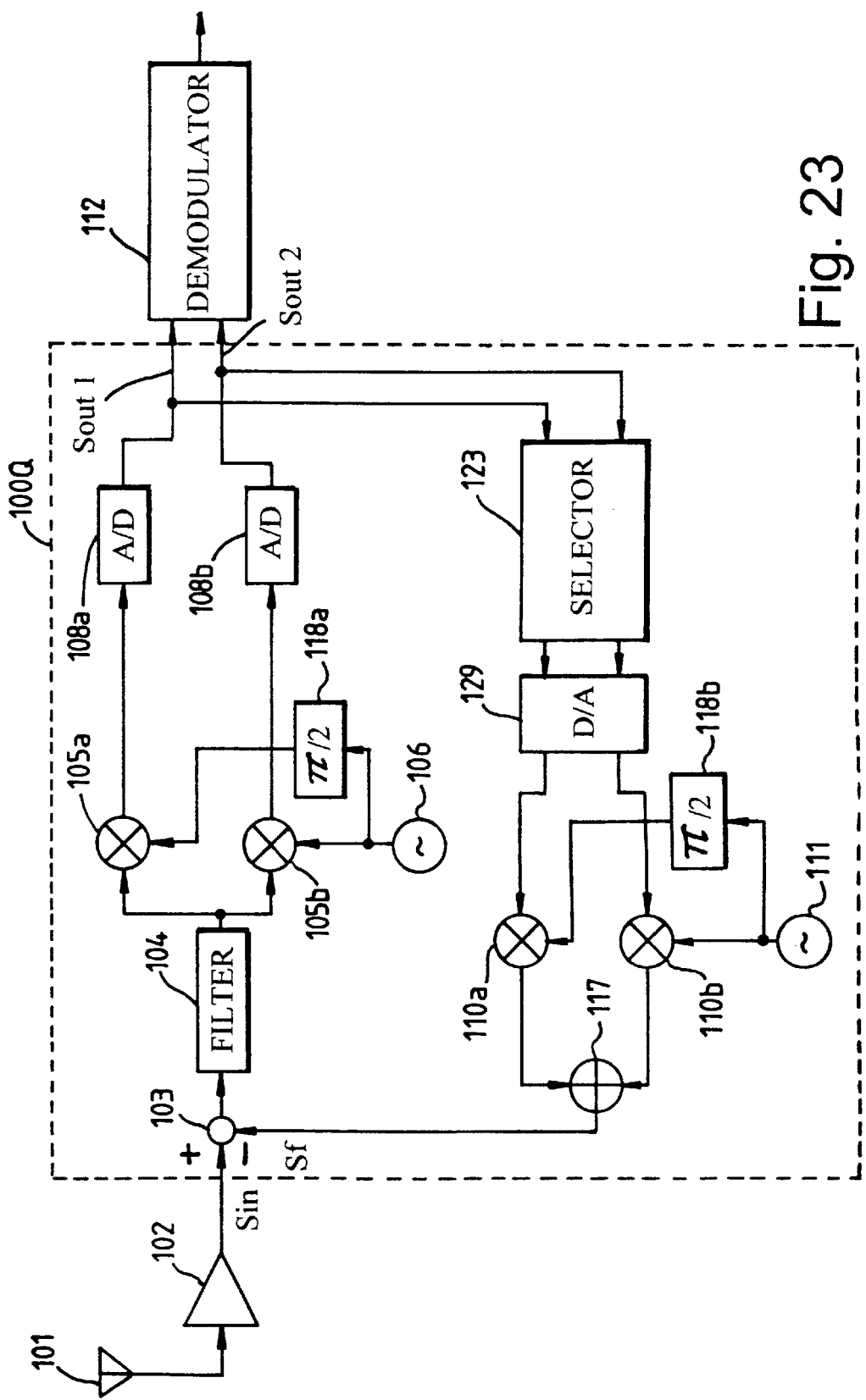
FIG. 23 is a block diagram of an A/D conversion apparatus according to a seventeenth embodiment of the present invention.

FIG. 23 is a block diagram of the A/D conversion apparatus in the receiver of the radio apparatus according to a seventeenth embodiment. In comparison with the tenth embodiment in FIG. 16, two D/A converters 109*a* and 109*b* are unified as one D/A converter 129, and two selectors 113*a* and 113*b* are unified as one selector 123. In the tenth embodiment shown in FIG. 16, the distortion and the noise generated by the dispersion of the characteristics of two D/A converters 109*a* and 109*b* are reduced. However, characteristics of two orthogonal signals do not coincide. For example, if gains for the two orthogonal signals are different, conversion characteristics fall. In the seventeenth embodiment, two selectors 113*a* and 113*b* are commonly used by the selector 123, and the conversion elements in two D/A converters 109*a* and 109*b* are commonly used by the D/A converter 129. Therefore, the characteristics of two D/A converters 109*a* and 109*b* are equal and the conversion characteristics goes up.

Figure 24:
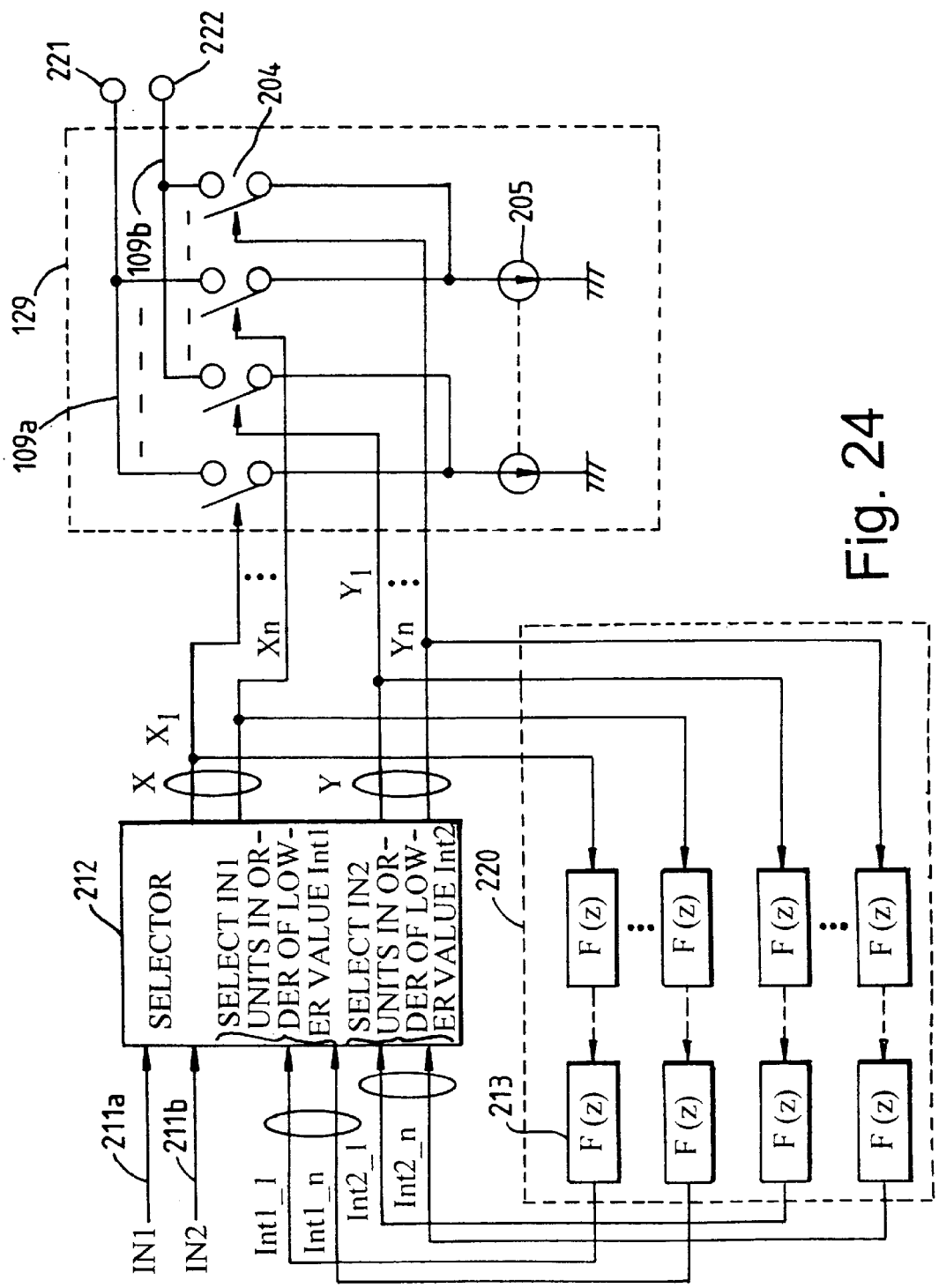
FIG. 24 is a block diagram of the selector and the D/A converter in FIG. 23.

FIG. 24 is a block diagram of the selector 123 and the D/A converter 129. In FIG. 24, the D/A converter 129 consists of n units of switches 204 and n units of current sources of equal current value. Each source 205 is serially connected to each switch 204. In this case, the current source 205 is the conversion element. Opposite terminals of the switches 204 for the current sources 205 are commonly connected at n nodes, and an output current corresponding to output of two D/A converters 109*a* and 109*b* is supplied from these two common connection nodes 221 and 222.

The selector 123 comprises a selector 212 and a filter circuit 220. The digital signals 211*a* and 211*b* respectively outputed from the A/ID converters 108*a* and 108*b* are input to the selector 212. These digital input signals 211*a* and 211*b* are respectively used as a signal representing the number IN1 and IN2 to select the conversion elements (the current source 205) in the D/A converters 109*a* and 109*b*. In response to the digital input signal 211a, the selector 212 determines IN1 units from n units of selection signal path Xi (X1~Xn), and outputs a selection signal "1" to IN1 units of signal path and non-selection signal "0" to the other signal path. In the same way, in response to the digital input signal 211b, the selector 212 determines IN2 units from n units of selection signal path Yi (Y1~Yn), and outputs a selection signal "1" to the IN2 units of signal path and non-selection signal "0" to the other signal path. The selection signals Xi and Yi are also input to the filter circuit 220.

Outputs Int1_i (i=1~n) and Int2_i (i=1~n) from the filter circuit 220 are input (feedbacked)to the selector 212. The selector 212 selects IN1 units to output the selection signal "1" from the selection signal paths Xi(X1~Xn) in order of lower value of Int1_i (i=1~n), and selects IN2 units to output the selection signal "1" from the selection signal paths Yi (Y1~Yn) in order of lower value of Int_2i (i=1~n). These selection signals Xi and Yi are input to the D/A converters 129. The IN1 units corresponding to "Xi=1" from the switches 204 of the D/A converter 109a are turned on and the IN2 units corresponding to "Yi=1" from the switches 204 of the D/A converter 109b are turned on. The other switches 204 are turned off.

The filter circuit 220 consisting of a plurality of filters 213, calculates a number of use $Int1_{13}i$ (i=1~n) of each current source 205 corresponding to the D/A converter 109a by filtering the selection signal Xi (for example, integration) and calculates a number of use Int2_i (i=1~n) of each current source 205 corresponding to the D/A converter 109b by filtering the selection signal Yi. In short, the selection signals Xi and Yi from the selector 212 are input to corresponding filter 213 respectively. Each filter 213 outputs the number of use of corresponding current source as the input signal $Int1_{13}i$ (i=1~n) or $Int2_{13}i$ (i=1~n)to the selector 212. In case of using "$F(Z)=1/(1-Z^{-1})$" as characteristics of each filter 213, noise neighboring low frequency of the output signal from the D/A converter 129 is reduced.

In the D/A converter 129, a sum of current from the current sources 205 corresponding to the selection signal "Xi=1" and "Yi=1" is respectively output as the output current from the common connection nodes 221 and 222. In short, each output current is determined by the number IN1 of the selection signal "Xi=1" and the number IN2 of the selection signal "Yi=1" respectively. In case of realizing the D/A converter 129 by LSI, the current source 205 is realized by a transistor. In this case, output current from each current source 205 is not exactly equal by dispersion of transistor characteristics, and the output current from the D/A converter 129 includes a conversion error. However, in the seventeenth embodiment, effect of the conversion error for bandwidth of predetermined frequency is reduced.

Furthermore, in the seventeenth embodiment, the current source 205 of the D/A converter 129 is common to two D/A converters 109a and 109b. The current sources 205 are selected so that the number of the current sources as the D/A converter 109a is equal to the number of the current sources as the D/A converter 109b. Accordingly, noise components and gains of predetermined frequency of two outputs from the D/A converter 129 are equal.

Figure 25:
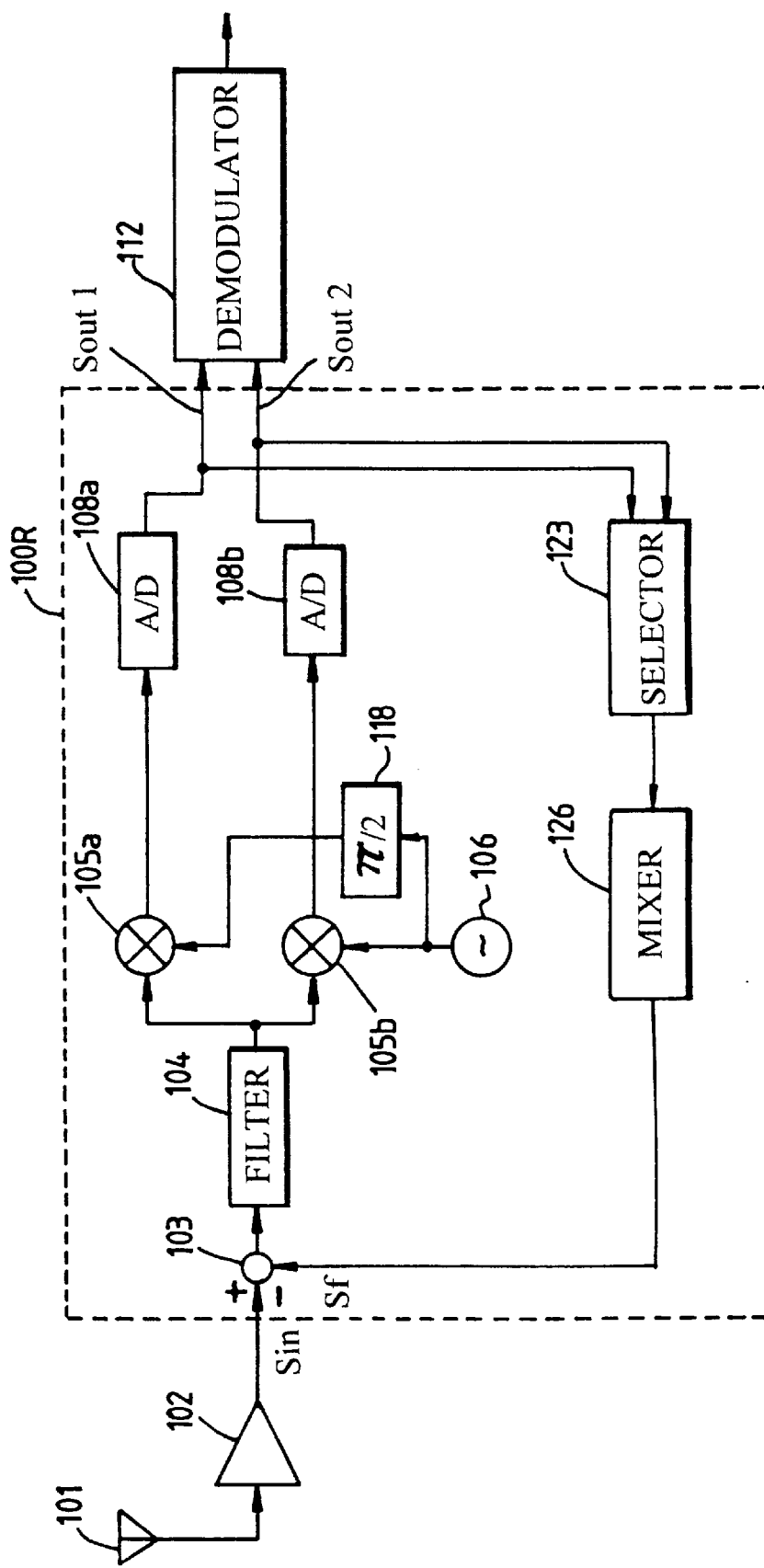
FIG. 25 is a block diagram of an A/D conversion apparatus according to an eighteenth embodiment of the present invention.

FIG. 25 is a block diagram of the A/D conversion apparatus in the receiver of the radio apparatus according to an eighteenth embodiment. The D/A converter 129, two mixers 110a and 110b, the reference signal generator 111, π/2 phase shifter 118b and the adder 117 shown in FIG. 24 are all replaced by one digital mixer 126 shown in FIG. 25. In the eighteenth embodiment, gain error of the mixer is reduced and the conversion accuracy further goes up.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. An A/D conversion apparatus, comprising:

subtraction means for subtracting a first signal from a second signal, and for outputting a third signal as a subtraction result;

first conversion means for converting the third signal into a digital signal of predetermined frequency different from a frequency of the second signal; and second conversion means for converting the digital signal into an analog signal of a frequency nearly equal to the frequency of the second signal, and for supplying the analog signal as the first signal to said subtraction means;

wherein said second conversion means includes a plurality of current sources, a filter means for calculating a number of use of each of the plurality of current sources, and a selection means for selecting the current sources having a lower value of the number of use, the number of selected current sources corresponding to the value of the digital signal.

2. The A/D conversion apparatus according to claim 1, wherein said first conversion means includes a first frequency conversion means for generating the third signal having a predetermined frequency different from the frequency of the second signal, and. A/D conversion means for converting an output signal from the first frequency conversion means to the digital signal.

3. The A/D conversion apparatus according to claim 2, wherein said second conversion means includes D/A conversion means for converting the digital signal into the analog signal, and a second frequency conversion means for converting the analog signal into a frequency nearly equal to the frequency of the second signal.

4. The A/D conversion apparatus according to claim 3, wherein said D/A conversion means includes a plurality of current sources each of which supplies analog current, and a plurality of switches each being serially connected to one of the plurality of current sources.

5. The A/D conversion apparatus according to claim 4, wherein said selection means selectively turns on the plurality of switches to output the analog current supplied from the selected current sources.

6. The A/D conversion apparatus according to claim 5, wherein said filter means includes a plurality of filers connected to each signal line turning on each of the plurality of switches, each of the plurality of filters calculating an integration value as the number of use in response to a selection signal output from said selection means.

7. The A/D conversion apparatus according to claim 6, wherein said selection means selects the signal lines having a lower integration value calculated by the plurality of filters in order from the lowest integration value, and outputs the selection signal to the corresponding signal lines.

8. The A/D conversion apparatus according to claim 1, wherein said second conversion means includes a plurality of mixers selected by said selection means, a reference signal generation means for supplying a reference signal to the plurality of mixers, and an addition means for adding output signals from the selected mixers.

9. The A/D conversion apparatus according to claim 2, wherein said A/D conversion means samples the third signal at a sampling rate less than twice the frequency of the second signal.

10. The A/D conversion apparatus according to claim 3, wherein said D/A conversion means outputs an analog signal having a rectangular wave from the digital signal as the first signal.

11. An A/D conversion apparatus, comprising:

subtraction means for subtracting a first signal from a second signal, and for outputting a third signal as a subtraction result;

first conversion means for converting the third signal into two digital signals whose frequencies are orthogonal to each other and are different from a frequency of the second signal; and second conversion means for converting the two digital signals to two analog signals, and for adding the two analog signals as the first signal whose frequency is nearly equal to the frequency of the second signal;

wherein said second conversion means includes a plurality of current sources, a filter means for calculating a number of use of each of the plurality of current sources, and a selection means for selecting the current sources having a lower value of the number of use, the number of selected current sources corresponding to each value of the two digital signals.

12. The A/D conversion apparatus according to claim 11, wherein said first conversion means includes a first orthogonal frequency conversion means for converting the third signal as two orthogonal signals different from the frequency of the second signal, a first A/D conversion means for converting one of the two orthogonal signals to a first digital signal, and a second A/D conversion means for converting the other of the two orthogonal signals to a second digital signal.

13. The A/D conversion apparatus according to claim 12, wherein said second conversion means includes a first D/A conversion means for converting the first digital signal to a first analog signal, a second D/A conversion means for converting the second digital signal to a second analog signal, and a second orthogonal frequency conversion means for converting the first and the second analog signals to two orthogonal signals and for adding the two orthogonal signals as the first signal whose frequency is nearly equal to the frequency of the second signal.

14. The A/D conversion apparatus according to claim 13, wherein said first and second D/A conversion means respectively include a plurality of current sources each of which supplies analog current, and a plurality of switches each being serially connected to one of the plurality of current sources.

15. The A/D conversion apparatus according to claim 14, wherein said selection means includes a first selection means for selectively turning on the plurality of switches to output the analog current supplied from the selected current sources in said first D/A conversion means, and a second selection means for selectively turning on the plurality of switches to output the analog current supplied from the selected current sources in said second D/A conversion means.

16. The A/D conversion apparatus according to claim 15, wherein said filter means includes a first filter means for including a plurality of filters connected to each signal line turning on each o:E the plurality of switches in said first D/A conversion means, each of the plurality of filters calculates an integration value as the number of use in response to a first selection signal output from said first selection means, and a second filter means for including a plurality of filters connected to each signal line turning on each of the plurality of switches in said second D/A conversion means, each of the plurality of filters calculates an integration value as the number of use in response to a second selection signal output from said second selection means.

17. The A/D conversion apparatus according to claim 16, wherein said first selection means selects a first number of the signal lines corresponding to lower integration value calculated by the plurality of filters of said first filter means in order from the lowest integration value, the first number corresponds to the value of the first digital signal, and outputs the first selection signal to the first number of the signal lines, and wherein said second selection means selects a second number of the signal lines corresponding to lower integration value calculated by the plurality of filters of said second filter means in order from the lowest integration value, the second number corresponds to the value of the second digital signal, and outputs the second selection signal to the second number of the signal lines.

18. The A/D conversion apparatus according to claim 12, wherein said first A/D conversion means executes sampling of the third signal by a first clock signal, and wherein said second A/D conversion means executes sampling of the third signal by a second clock signal of which a phase difference from the first clock signal is 90° a frequency of the sampling being less than twice the frequency of the second signal.

19. The A/D conversion apparatus according to claim 13, wherein said first D/A conversion means outputs a first analog signal having a rectangular wave from the first digital signal by a first clock signal, and wherein said second D/A conversion means outputs a second analog signal having a rectangular wave from the second digital signal by a second clock signal of which a phase difference from the first clock signal is 90°.

20. A radio apparatus, comprising:

receiving means for receiving a harmonic signal;

subtraction means for subtracting a first signal from a second signal as the harmonic signal, and for outputting a third signal as a subtraction result;

first conversion means for converting the third signal into a digital signal of predetermined frequency different from a frequency of the second signal;

second conversion means for converting the digital signal into an analog signal of a frequency nearly equal to the frequency of the second signal, and for supplying the analog signal as the first signal to said subtraction means;

wherein said second conversion means includes a plurality of current sources, a filter means for calculating a number of use of each of the plurality of current sources, and a selection means for selecting the current sources having a lower value of the number of use, the number of selected current sources corresponding to the value of the digital signal; and demodulation means for demodulating the digital signal output from said first conversion means.

21. A radio apparatus, comprising:

receiving means for receiving a harmonic signal;

subtraction means for subtracting a first signal from a second signal as the harmonic signal, and for outputting a third signal as a subtraction result;

first conversion means for converting the third signal into two digital signals whose frequencies are orthogonal to each other and are different from a frequency of the second signal;

second conversion means for converting the two digital signals into two analog signals, and for adding the two analog signals as the first signal whose frequency is nearly equal to the frequency of the second signal;

wherein said second conversion means includes a plurality of current sources, a filter means for calculating a number of use of each of the plurality of current sources, and a selection means for respectively selecting the current sources having a lower value of the number of use, the number of selected current sources corresponding to each value of the two digital signals; and demodulation means for demodulating the two digital signals output from said first conversion means.

22. An A/D conversion apparatus, comprising:

a subtractor configured to subtract a first signal from a second signal, and to output a third signal as a subtraction result;

a first conversion unit configured to convert the third signal into a digital signal of predetermined frequency different from a frequency of the second signal; and a second conversion unit configured to convert the digital signal into an analog signal of a frequency nearly equal to the frequency of the second signal, and to supply the analog signal as the first signal to said subtractor;

wherein said second conversion unit includes a plurality of current sources, a filter configured to calculate a number of use of each of the plurality of current sources, and a selection unit configured to select the current sources having a lower value of the number of use, the number of selected current sources corresponding to the value of the digital signal.

23. The A/D conversion apparatus according to claim 22, wherein said first conversion unit includes a first frequency conversion unit configured to generate the third signal having a predetermined frequency different from the frequency of the second signal, and an A/D converter configured to convert an output signal from the first frequency conversion unit to the digital signal.

24. The A/D conversion apparatus according to claim 23, wherein said second conversion unit includes a D/A converter configured to convert the digital signal into the analog signal, and a second frequency conversion unit configured to convert the analog signal into a frequency nearly equal to the frequency of the second signal.

25. The A/D conversion apparatus according to claim 24, wherein said D/A converter includes a plurality of current sources each of which supplies analog current, and a plurality of switches each being serially connected to one of the plurality of current sources.

26. The A/D conversion apparatus according to claim 25, wherein said selection unit selectively turns on the plurality of switches to output the analog current supplied from the selected current sources.

27. The A/D conversion apparatus according to claim 26, wherein said filter includes a plurality of filers connected to each signal line turning on each of the plurality of switches, each of the plurality of filters calculating an integration value as the number of use in response to a selection signal output from said selection unit.

28. The A/D conversion apparatus according to claim 27, wherein said selection unit selects the signal lines having a lower integration value calculated by the plurality of filters in order from the lowest integration value, and outputs the selection signal to the corresponding signal lines.

29. The A/D conversion apparatus according to claim 22, wherein said second conversion unit includes a plurality of mixers selected by said selection unit, a reference signal generator configured to supply a reference signal to the plurality of mixers, and an adder configured to add output signals from the selected mixers.

30. The A/D conversion apparatus according to claim 23, wherein said A/D converter samples the third signal at a sampling rate less than twice the frequency of the second signal.

31. The A/D conversion apparatus according to claim 24, wherein said D/A converter outputs an analog signal having a rectangular wave from the digital signal as the first signal.

32. An A/D conversion apparatus, comprising:

a subtractor configured to subtract a first signal from a second signal, and to output a third signal as a subtraction result;

a first conversion unit configured to convert the third signal into two digital signals whose frequencies are orthogonal to each other and are different from a frequency of the second signal; and a second conversion unit configured to convert the two digital signals to two analog signals, and to add the two analog signals as the first signal whose frequency is nearly equal to the frequency of the second signal;

wherein said second conversion unit includes a plurality of current sources, a filter configured to calculate a number of use of each of the plurality of current sources, and a selection unit configured to select the current sources having a lower value of the number of use, the number of selected current sources corresponding to each value of the two digital signals.

33. The A/D conversion apparatus according to claim 32, wherein said first conversion unit includes a first orthogonal frequency conversion unit configured to convert the third signal as two orthogonal signals different from the frequency of the second signal, a first A/D converter configured to convert one of the two orthogonal signals to a first digital signal, and a second A/D converter configured to convert the other of the two orthogonal signals to a second digital signal.

34. The A/D conversion apparatus according to claim 33, wherein said second conversion unit includes a first D/A converter configured to convert the first digital signal to a first analog signal, a second D/A converter configured to convert the second digital signal to a second analog signal, and a second orthogonal frequency conversion unit configured to convert the first and the second analog signals to two orthogonal signals and to add the two orthogonal signals as the first signal whose frequency is nearly equal to the frequency of the second signal.

35. The A/D conversion apparatus according to claim 34, wherein said first and second D/A converters respectively include a plurality of current sources each of which supplies analog current, and a plurality of switches each being serially connected to the plurality of current sources.

36. The A/D conversion apparatus according to claim 35, wherein said selection unit includes a first selection unit configured to selectively turn on the plurality of switches to output the analog current supplied from the selected current sources in said first D/A converter, and a second selection unit configured to selectively turn on the plurality of switches to output the analog current supplied from the selected current sources in said second D/A converter.

37. The A/D conversion apparatus according to claim 36, wherein said filter includes a first filter having a plurality of filters connected to each signal line turning on each of the plurality of switches in said first D/A converter, each of the plurality of filters calculates an integration value as the number of use in response to a first selection signal output from said first selection unit, and a second filter having a plurality of filters connected to each signal line turning on each of the plurality of switches in said second D/A converter, each of the plurality of filters calculates an integration value as the number of use in response to a second selection signal output from said second selection unit.

38. The A/D conversion apparatus according to claim 37, wherein said first selection unit selects a first number of the signal lines corresponding to a lower integration value calculated by the plurality of filters of said first filter in order from the lowest integration value, the first number corresponds to the value of the first digital signal, and outputs the first selection signal to the first number of the signal lines, and wherein said second selection unit selects a second number of the signal lines corresponding to the lower integration value calculated by the plurality of filters of said second filter in order from the lowest integration value, the second number corresponds to the value of the second digital signal, and outputs the second selection signal to the second number of the signal lines.

39. The A/D conversion apparatus according to claim 33, wherein said first A/D converter executes sampling of the third signal by a first clock signal, and wherein said second A/D converter executes sampling of the third signal by a second clock signal of which a phase difference from the first clock signal is 90°, a frequency of the sampling being less than twice the frequency of the second signal.

40. The A/D conversion apparatus according to claim 34, wherein said first D/A converter outputs a first analog signal having a rectangular wave from the first digital signal by a first clock signal, and wherein said second D/A converter outputs a second analog signal having a rectangular wave from the second digital signal by a second clock signal of which a phase difference from the first clock signal is 90°.

41. A radio apparatus, comprising:

a receiver configured to receive a harmonic signal;

a subtractor configured to subtract a first signal from a second signal as the harmonic signal, and to output a third signal as a subtraction result;

a first conversion unit configured to convert the third signal into a digital signal of a predetermined frequency different from a frequency of the second signal;

a second conversion unit configured to convert the digital signal into an analog signal of a frequency nearly equal to the frequency of the second signal, and to supply the analog signal as the first signal to said subtractor;

wherein said second conversion unit includes a plurality of current sources, a filter configured to calculate a number of use of each of the plurality of current sources, and a selection unit configured to select the current sources having a lower value of the number of use, the number of selected current sources corresponding to the value of the digital signal; and a demodulation unit configured to demodulate the digital signal output from said first conversion unit.

42. A radio apparatus, comprising:

a receiver configured to receive a harmonic signal;

a subtractor configured to subtract a first signal from a second signal as the harmonic signal, and to output a third signal as a subtraction result;

a first conversion unit configured to convert the third signal into two digital signals whose frequencies are orthogonal to each other and are different from a frequency of the second signal;

a second conversion unit configured to convert the two digital signals into two analog signals, and to add the two analog signals as the first signal whose frequency is nearly equal to the frequency of the second signal;

wherein said second conversion unit includes a plurality of current sources, a filter configured to calculate a number of use of each of the plurality of current sources, and a selection unit configured to respectively select the current sources having a lower value of the number of use, the number of selected current sources corresponding to each value of the two digital signals; and a demodulation unit configured to demodulate the two digital signals output from said first conversion unit.

\* \* \* \* \*